(12) United States Patent
Yoshida et al.

(10) Patent No.: US 8,575,763 B2
(45) Date of Patent: Nov. 5, 2013

(54) SEMICONDUCTOR DEVICE AND METHOD OF MANUFACTURING THE SAME

(75) Inventors: Masanori Yoshida, Tokyo (JP);
Fumitomo Watanabe, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/878,698

(22) Filed: Sep. 9, 2010

(65) Prior Publication Data
US 2011/0057327 A1    Mar. 10, 2011

(30) Foreign Application Priority Data

Sep. 10, 2009  (JP) ................................ 2009-209117

(51) Int. Cl.
*H01L 23/48* (2006.01)
(52) U.S. Cl.
USPC ........... 257/777; 257/621; 257/678; 257/685; 257/686; 257/787; 257/790; 257/E23.116; 257/E23.126; 257/E23.129; 257/E23.174; 257/E23.169; 257/E23.194; 361/761
(58) Field of Classification Search
USPC ......... 257/621, 678, 685, 686, 777, 787, 790, 257/E23.126, E23.129, E23.116, E23.174, 257/E23.169, E23.194; 361/761
See application file for complete search history.

(56) References Cited

U.S. PATENT DOCUMENTS

| 2004/0113261 | A1* | 6/2004 | Sunohara et al. | 257/700 |
| 2007/0013048 | A1* | 1/2007 | Sunohara et al. | 257/698 |
| 2008/0117608 | A1* | 5/2008 | Seo et al. | 361/761 |
| 2008/0246135 | A1* | 10/2008 | Wong et al. | 257/686 |
| 2008/0308921 | A1* | 12/2008 | Kim | 257/686 |
| 2009/0051024 | A1* | 2/2009 | Chia | 257/686 |
| 2010/0072606 | A1* | 3/2010 | Yang | 257/692 |
| 2011/0156233 | A1* | 6/2011 | Kim | 257/686 |

FOREIGN PATENT DOCUMENTS

| JP | 2000-124164 (A) | 4/2000 |
| JP | 2006-319243 (A) | 11/2006 |
| JP | 2007-214220 (A) | 8/2007 |

* cited by examiner

*Primary Examiner* — Peniel M Gumedzoe
(74) *Attorney, Agent, or Firm* — Foley & Lardner LLP

(57) ABSTRACT

A semiconductor device includes a first wiring hoard, a second semiconductor chip, and a second seal. The first wiring board includes a first substrate, a first semiconductor chip, and a first seal. The first semiconductor chip is disposed on the first substrate. The first seal is disposed on the first substrate. The first seal surrounds the first semiconductor chip. The first seal has the same thickness as the first semiconductor chip. The second semiconductor chip is stacked over the first semiconductor chip. The first semiconductor chip is between the second semiconductor chip and the first substrate. The second semiconductor chip is greater in size in plan view than the first semiconductor chip. The second seal seals at least a first gap between the first semiconductor chip and the second semiconductor chip.

22 Claims, 16 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same.

Priority is claimed on Japanese Patent Application No. 2009-209117, filed Sep. 10, 2009, the content of which is incorporated herein by reference.

2. Description of the Related Art

Recently, as shrinkage of an electronic device and increase in capacity thereof have been required, shrinkage of a semiconductor device integrated and increase in capacity thereof have been in progress. As a result, a Chip-On-Chip (CoC) semiconductor device has been on the development in which semiconductor chips each having a through electrode are stacked and mounted.

Japanese Unexamined Patent Application, First Publication, No. JP-A-2007-214220 discloses the CoC (Chip-On-Chip) semiconductor device. The CoC semiconductor device has a configuration that a plurality of semiconductor chips are stacked and mounted on a wiring board (a semiconductor wafer for an interposer).

Japanese Unexamined Patent Application, First Publication, No. JP-A-2006-319243 discloses that stacking the plurality of semiconductor chips over the wiring board using an underfill material may cause a void. To suppress the void formation between the semiconductor chips, a resin can be used having a viscosity lower than that of the underfill material. Japanese Unexamined Patent Application, First Publication, No. JP-A-2000-124164 discloses a method of suppressing the void formation by performing a sealing process under depressurized condition.

If semiconductor chips stacked and mounted have different chip sizes, the underfill material is not well-filled between the semiconductor chips. Any voids may be formed in gaps between the semiconductor chips.

If the temperature of the semiconductor device is increased in a reflow process gas in voids in the underfill material will expand. The gas expansion may cause cracking between the semiconductor chip and the wiring board or the semiconductor chips. As a result, flip chip connection are weakened and the reliability of the semiconductor device deteriorates.

In a CoC (Chip-On-Chip) semiconductor device of the related art, the plurality of semiconductor chips is stacked and mounted on the wring board (the semiconductor wafer for the interposer), resulting in the increased thickness of the package.

SUMMARY

In one embodiment, a semiconductor device may include, but is not limited to, a first wiring board, a second semiconductor chip, and a second seal. The first wiring board may include, but is not limited to, a first substrate, a first semiconductor chip, and a first seal. The first semiconductor chip may be disposed on the first substrate. The first seal may be disposed on the first substrate. The first seal may surround the first semiconductor chip. The first seal has the same thickness as the first semiconductor chip. The second semiconductor chip is stacked over the first semiconductor chip. The first semiconductor chip is between the second semiconductor chip and the first substrate. The second semiconductor chip is greater in size in plan view than the first semiconductor chip. The second seal seals at least a first gap between the first semiconductor chip and the second semiconductor chip.

In another embodiment, a semiconductor device may include, but is not limited to, a first wiring board, and a second semiconductor chip. The first wiring board may include, but is not limited to, a first semiconductor chip and a first seal. The first seal seals a periphery of the first semiconductor chip. The first semiconductor chip and the first seal form a planar structure. The second semiconductor chip may be stacked over the first semiconductor chip. The second semiconductor chip may be greater in size in plan view than the first semiconductor chip.

In still another embodiment, a semiconductor module may include, but is not limited to, a first semiconductor device and a second semiconductor device. The second semiconductor device may include, but is not limited to, a single semiconductor chip. The first semiconductor device may include, but is not limited to, a first wiring board, a second semiconductor chip, and a second seal. The first wiring board may include, but is not limited to, a first substrate, a first semiconductor chip, and a first seal. The first semiconductor chip is disposed on the first substrate. The first seal may be disposed on the first substrate. The first seal surrounds the first semiconductor chip. The first seal has the same thickness as the first semiconductor chip. The second semiconductor chip may be stacked over the first semiconductor chip. The first semiconductor chip may be between the second semiconductor chip and the first substrate. The second semiconductor chip is greater in size in plan view than the first semiconductor chip. The second seal seals at least a first gap between the first semiconductor chip and the second semiconductor chip.

BRIEF DESCRIPTION OF THE DRAWINGS

The above features and advantages of the present invention will be more apparent from the following description of certain preferred embodiments taken in conjunction with the accompanying drawings, in which.

Figure 1:
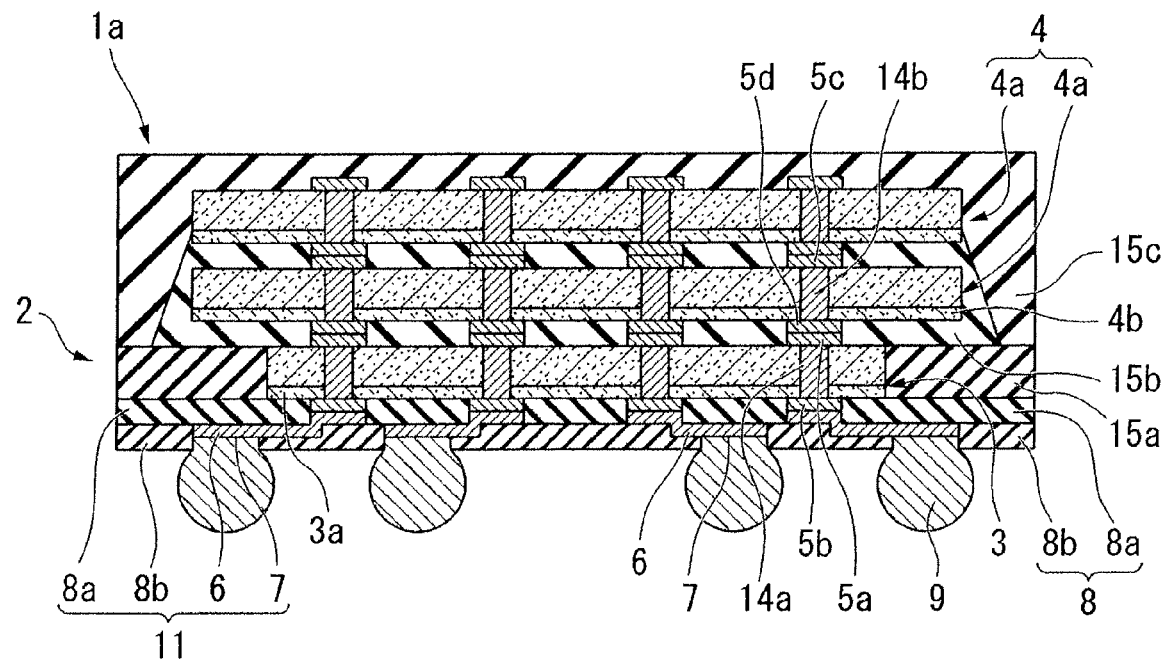
FIG. 1 is a schematic cross-sectional elevational view illustrating a CoC semiconductor device according to a first embodiment of the present invention.
Figure 2:
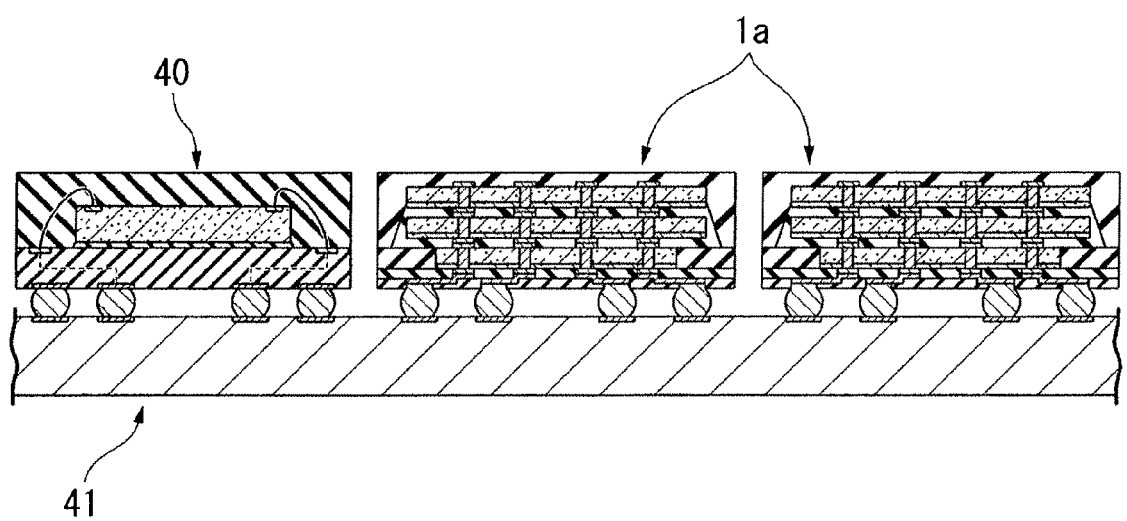
FIG. 2 is a cross-sectional elevational view illustrating the semiconductor device of FIG. 1 integrated in an electronic device such as a memory module in accordance with the first embodiment of the present invention.
Figure 4A:
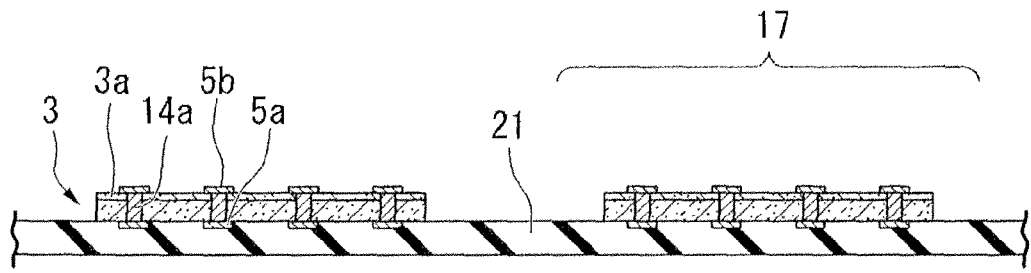
FIG. 4A is a cross-sectional elevational view illustrating a semiconductor device in a step involved in a method of manufacturing the semiconductor device of FIGS. 1 and 2 in accordance with the first embodiment of the present invention.
Figure 4B:
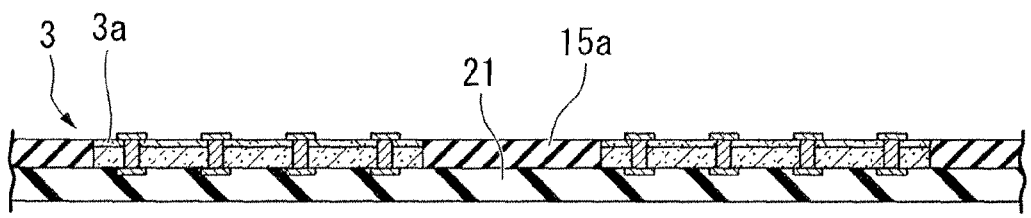
FIG. 4B is a cross-sectional elevational view illustrating a semiconductor device in a step, subsequent to the step of FIG. 4A, involved in the method of manufacturing the semiconductor device of FIGS. 1 and 2 in accordance with the first embodiment of the present invention.
Figure 4C:
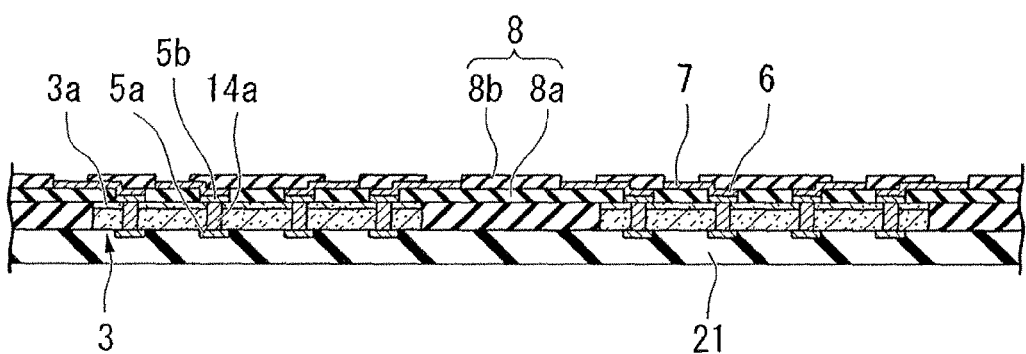
FIG. 4C is a cross-sectional elevational view illustrating a semiconductor device in a step, subsequent to the step of FIG. 4B, involved in the method of manufacturing the semiconductor device of FIGS. 1 and 2 in accordance with the first embodiment of the present invention.
Figure 4D:
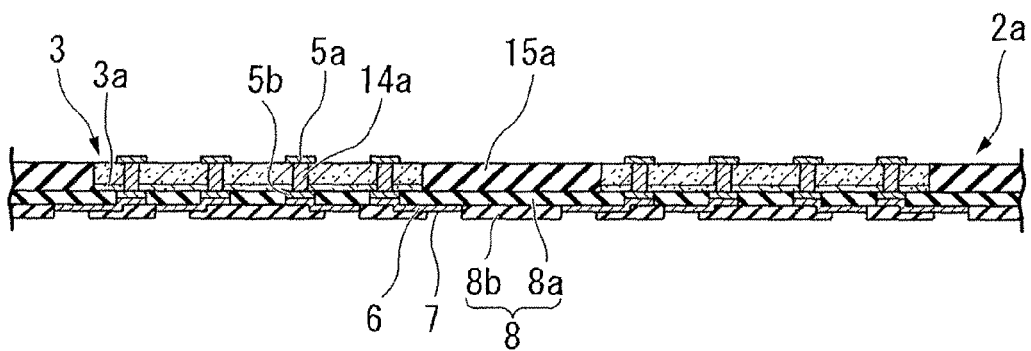
FIG. 4D is a cross-sectional elevational view illustrating a semiconductor device in a step, subsequent to the step of FIG.
Figure 4E:
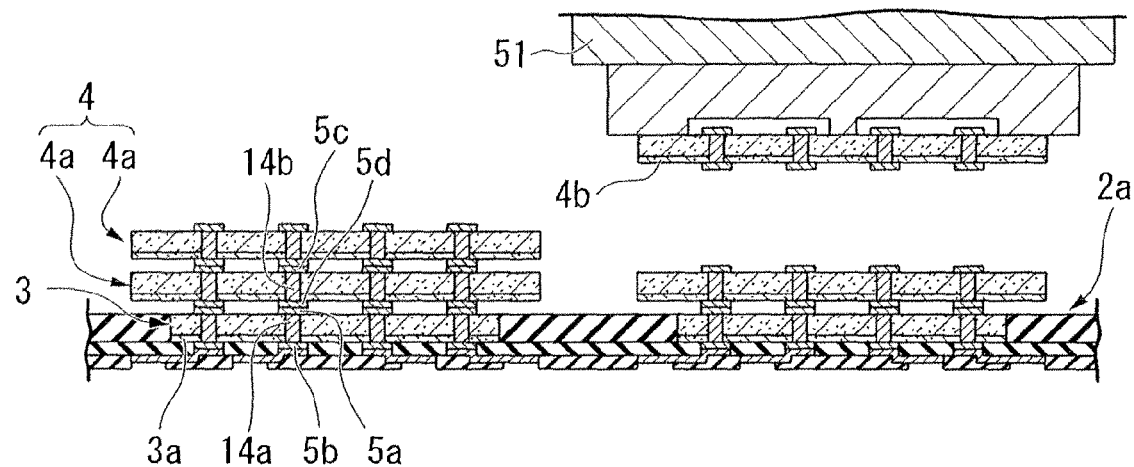
Figure 4F:
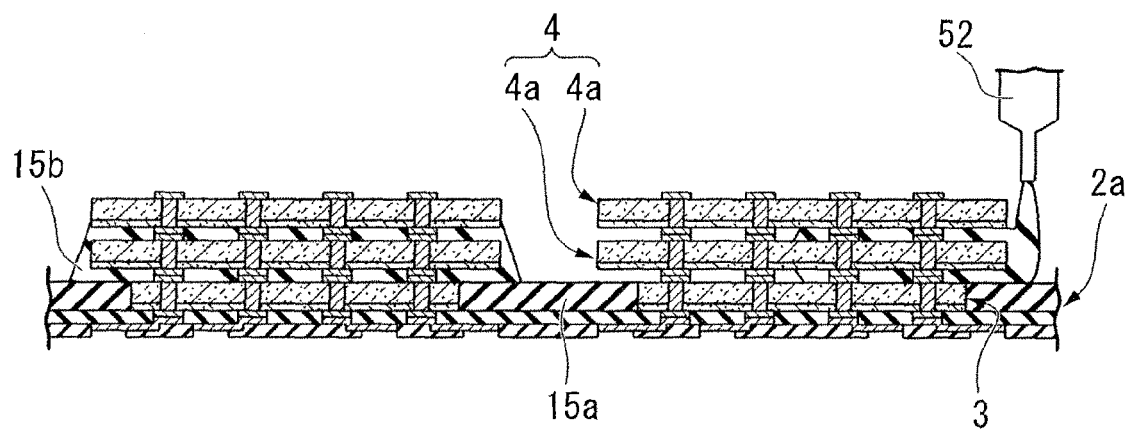
Figure 4G:
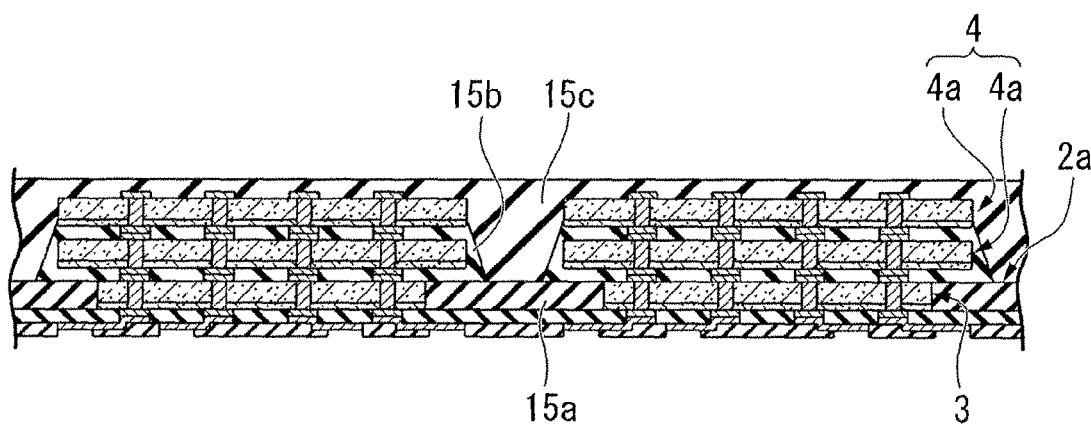
Figure 4H:
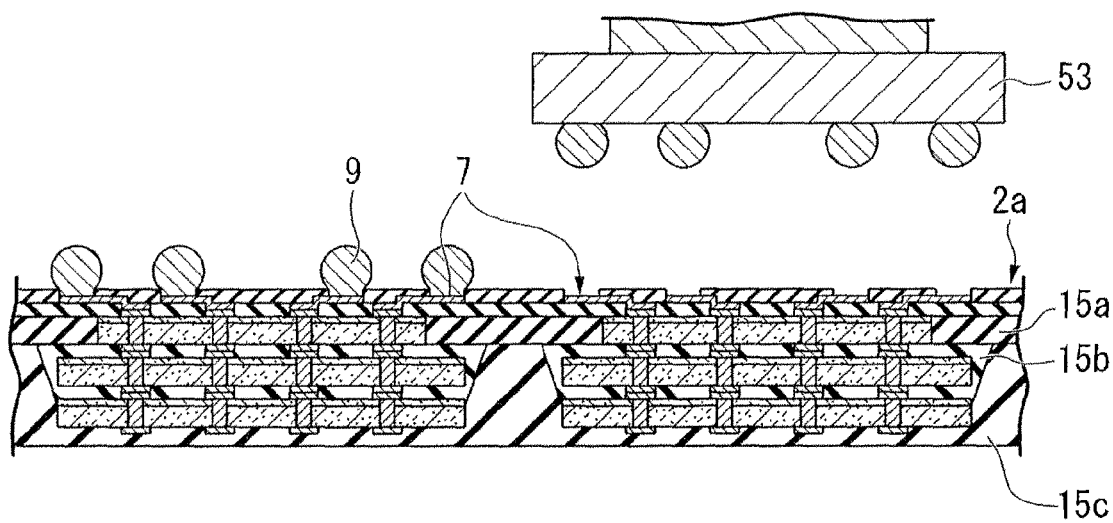
Figure 4I:
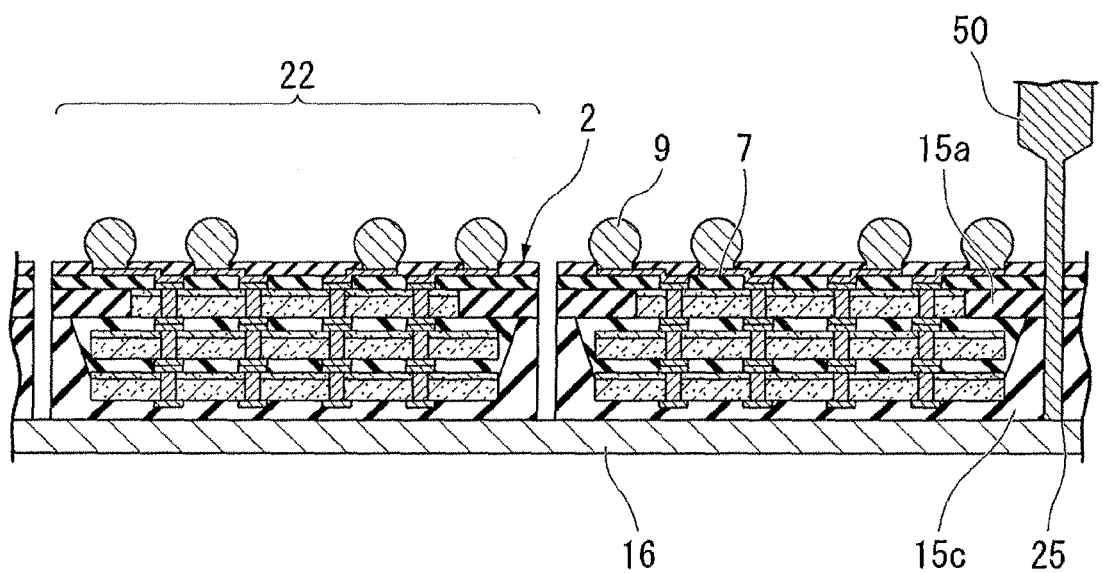
Figure 5:
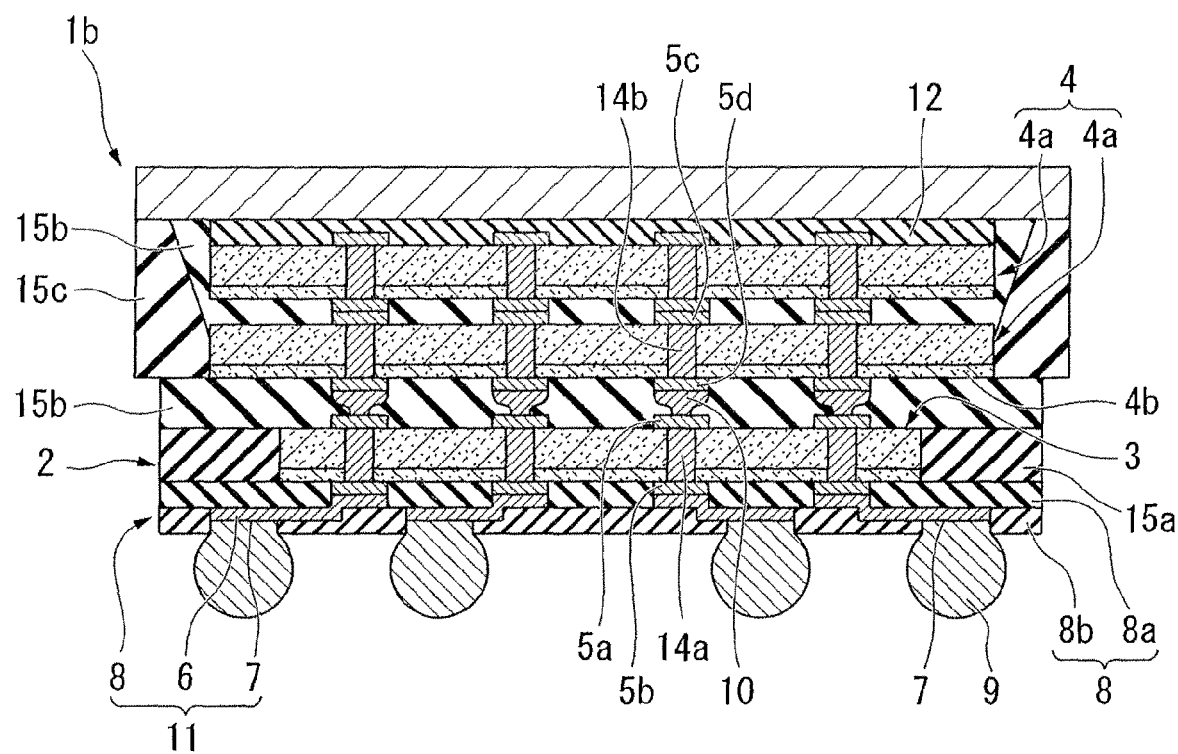
Figure 6A:
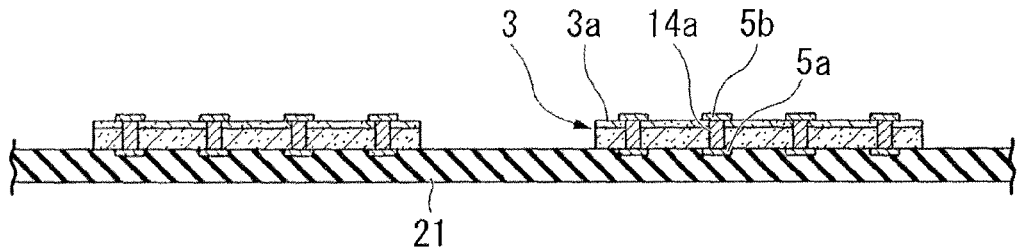
Figure 6B:
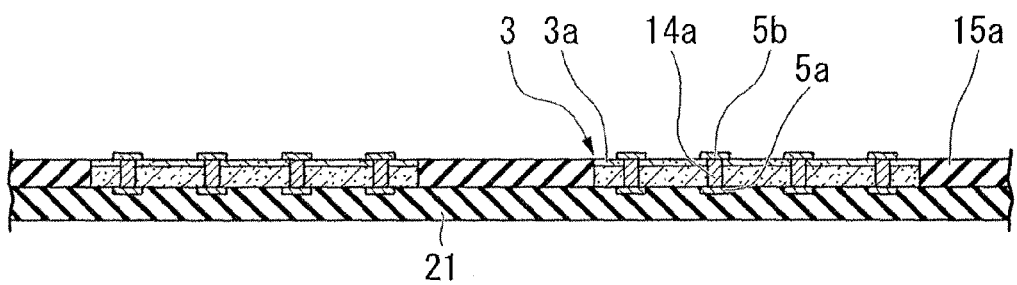
Figure 6C:
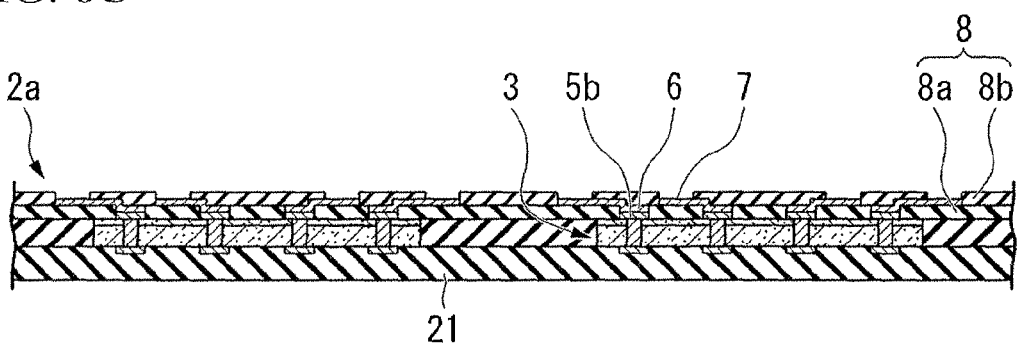
Figure 6D:
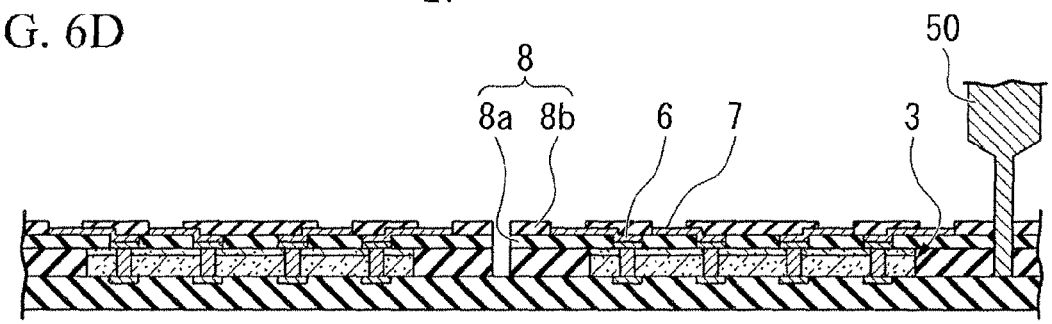
Figure 6E:
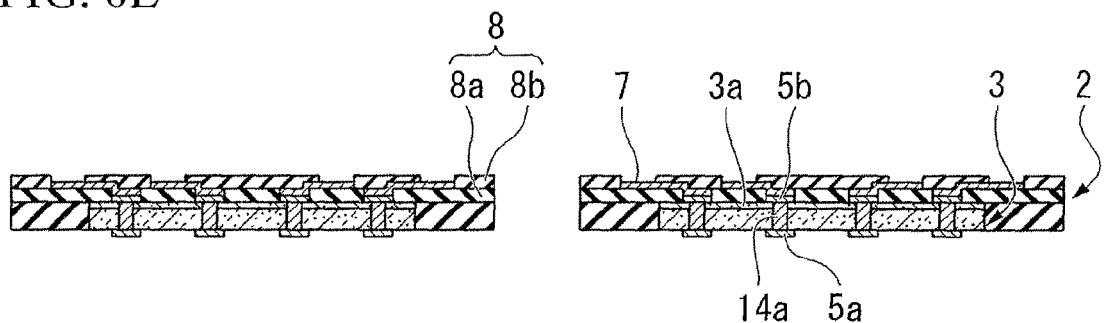
Figure 7:
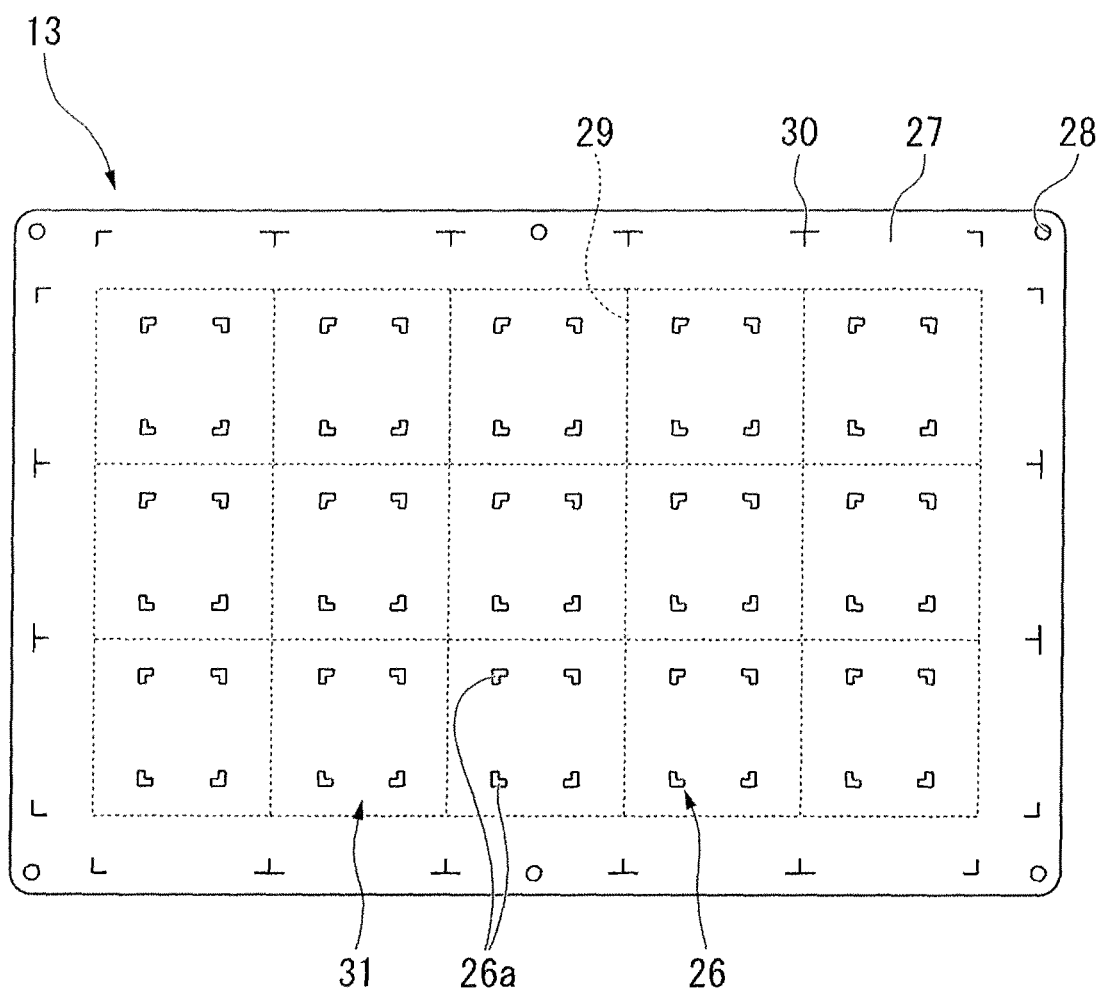
Figure 8A:
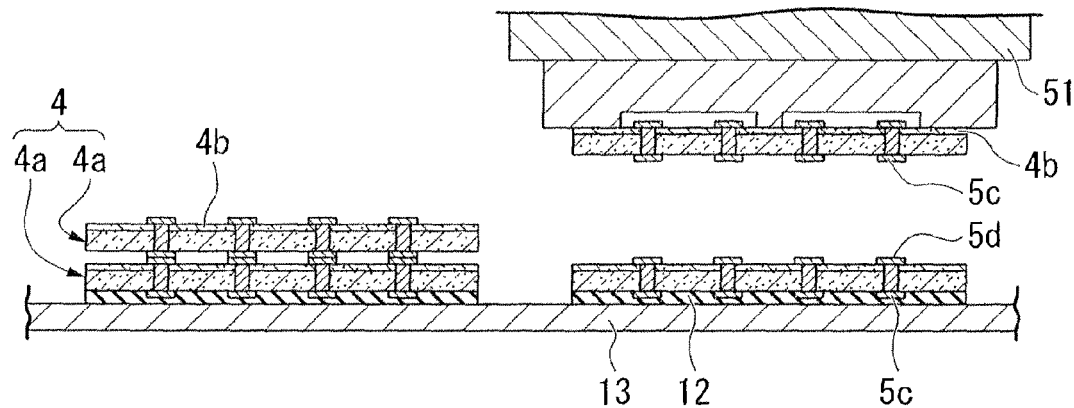
Figure 8B:
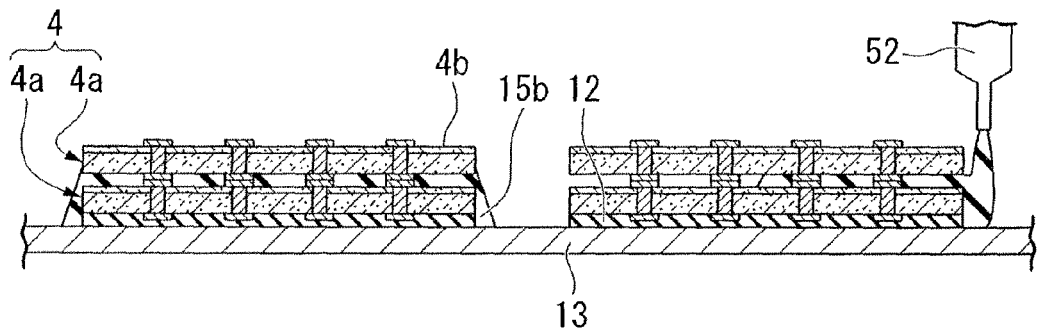
Figure 8C:
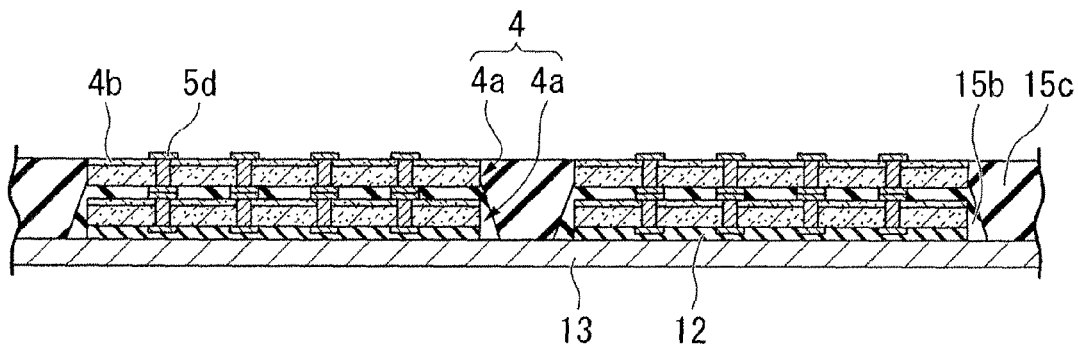
Figure 8D:
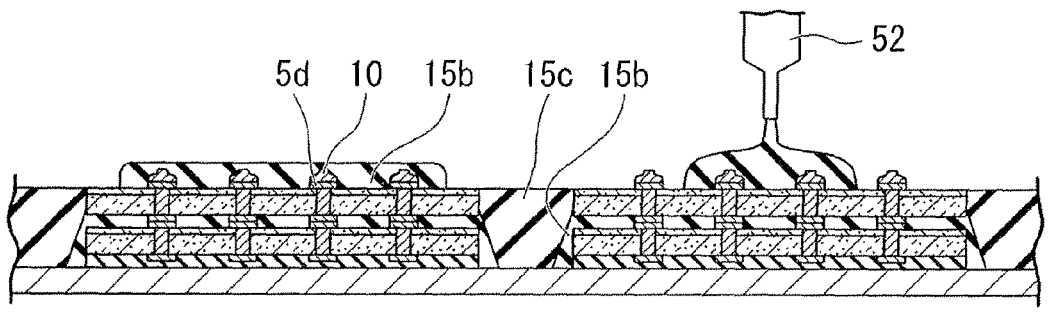
Figure 8E:
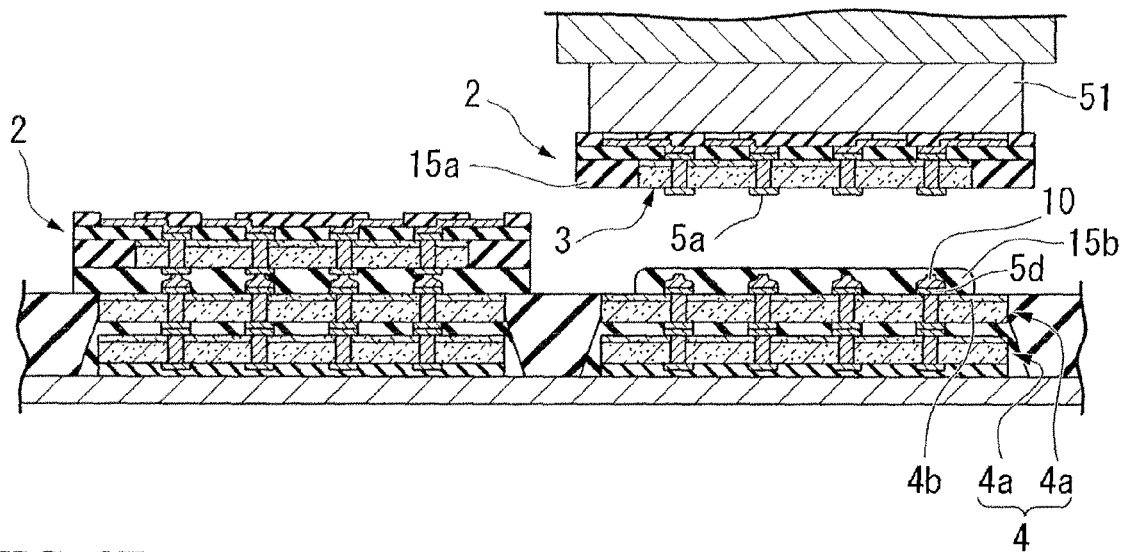
Figure 8F:
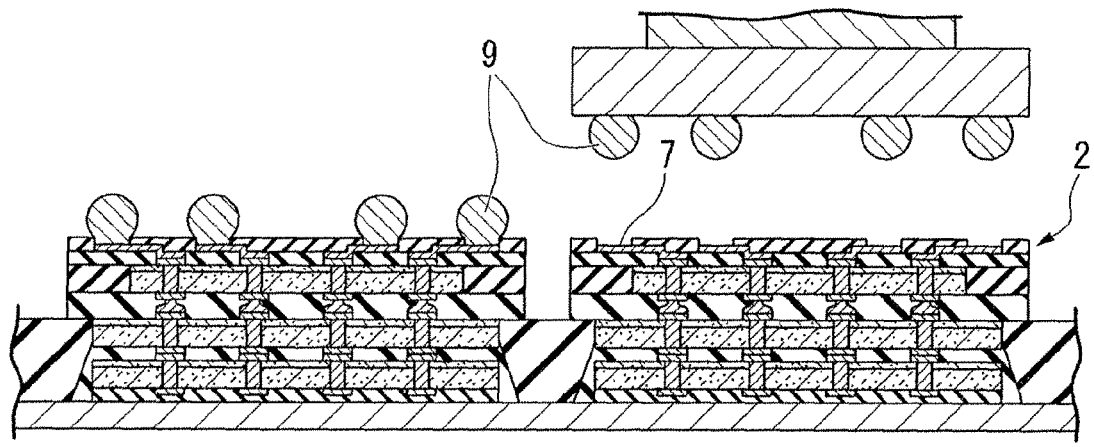
Figure 8G:
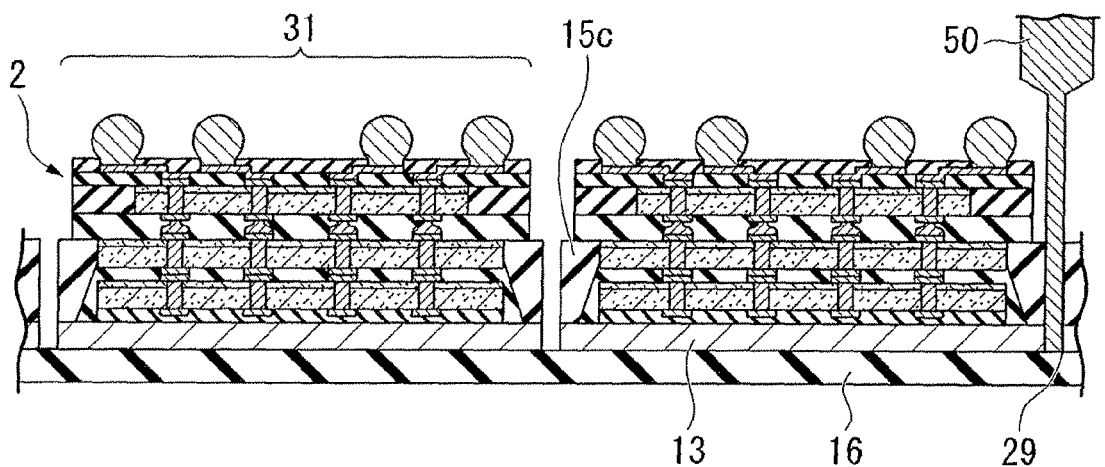
Figure 9:
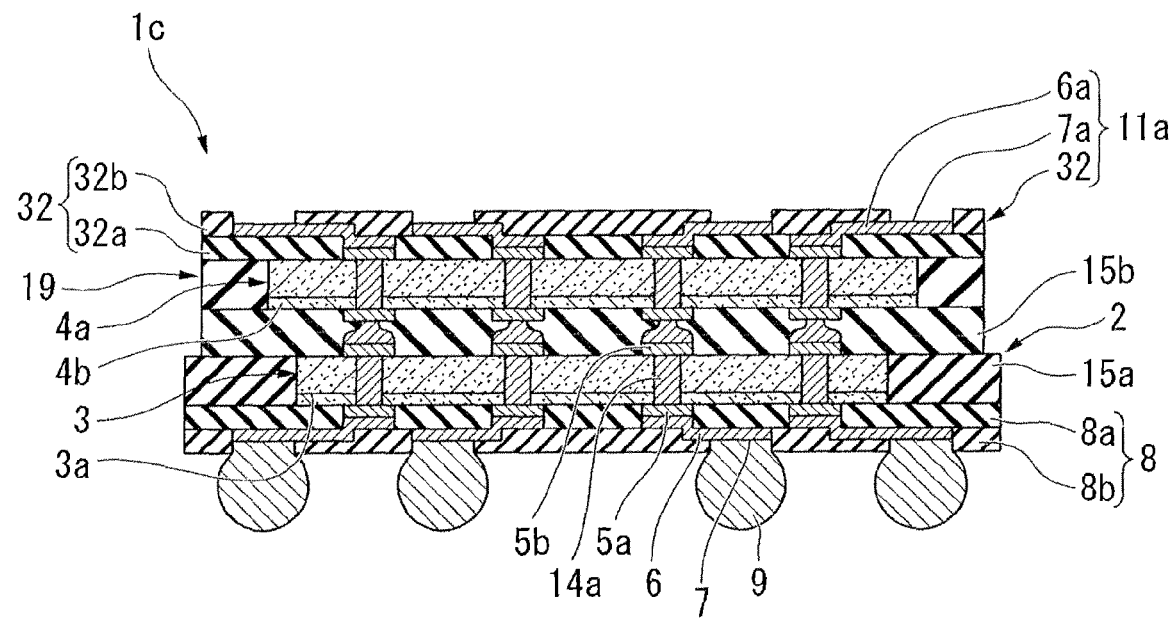
Figure 10:
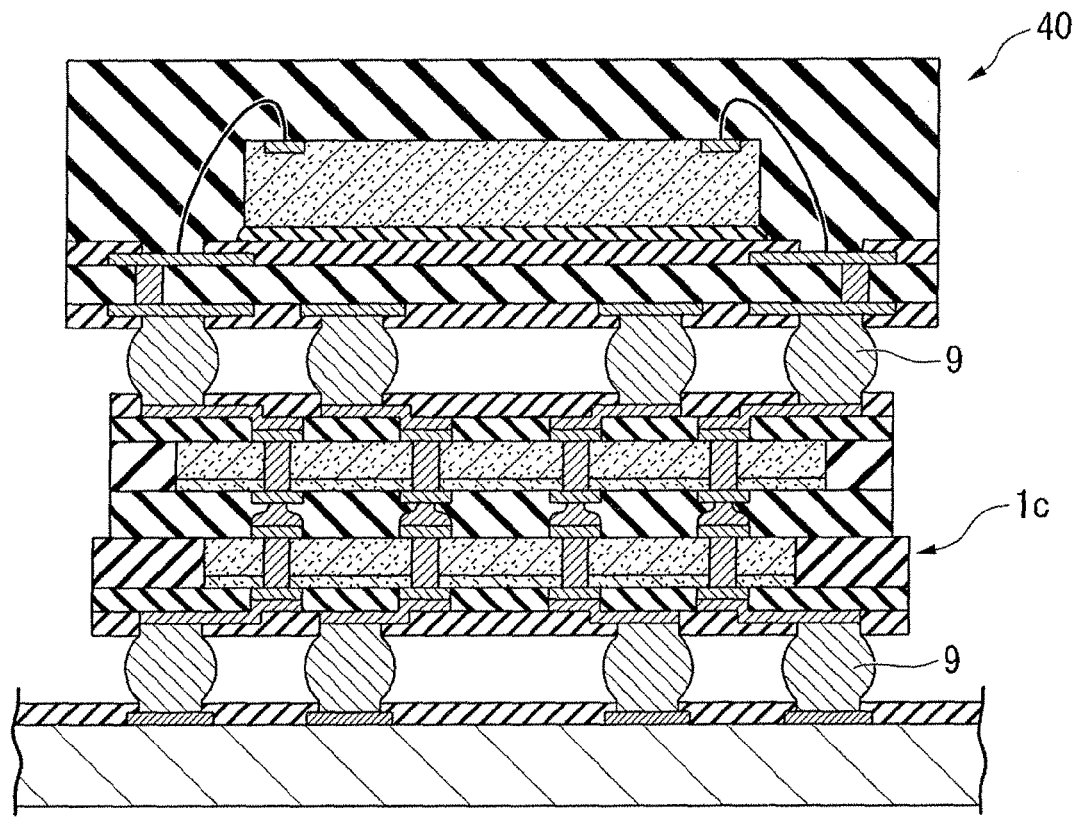
Figure 11A:
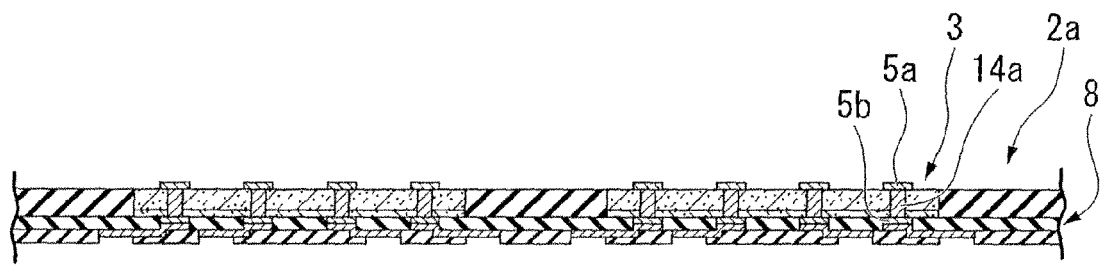
Figure 11B:
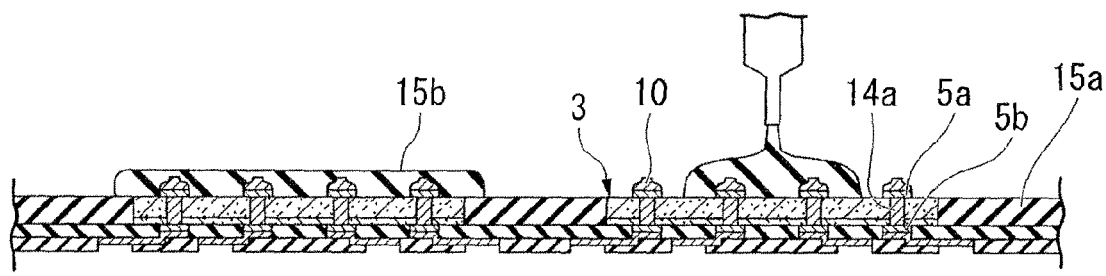
Figure 11C:
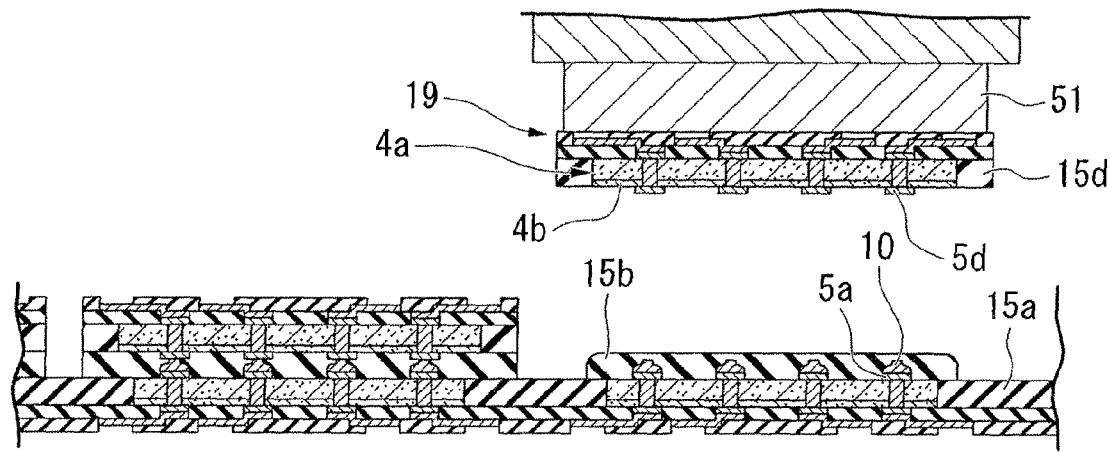
Figure 11D:
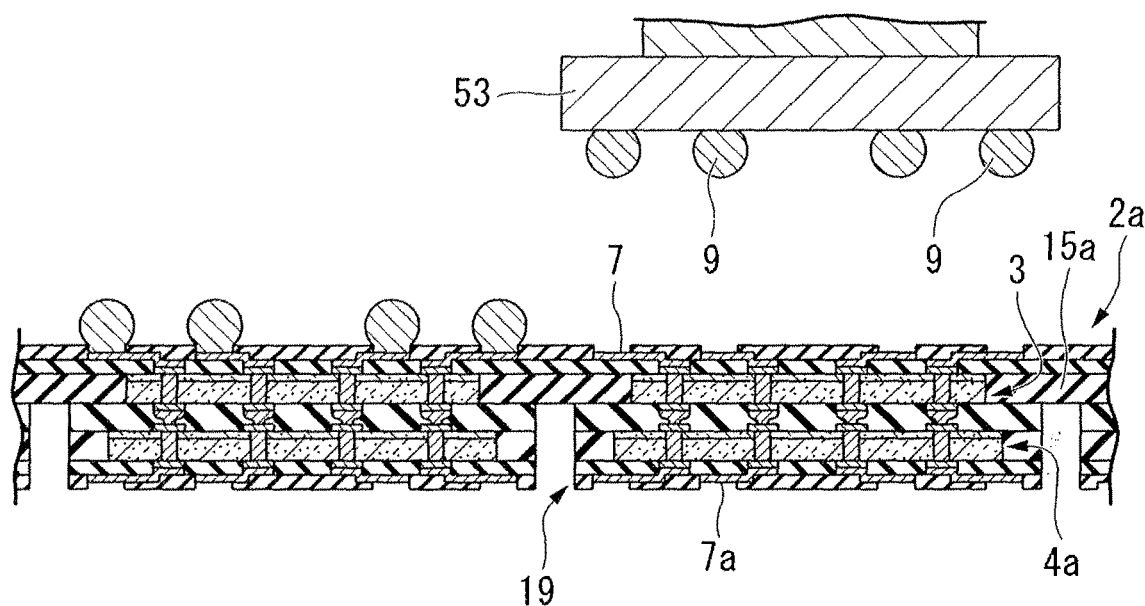
Figure 11E:
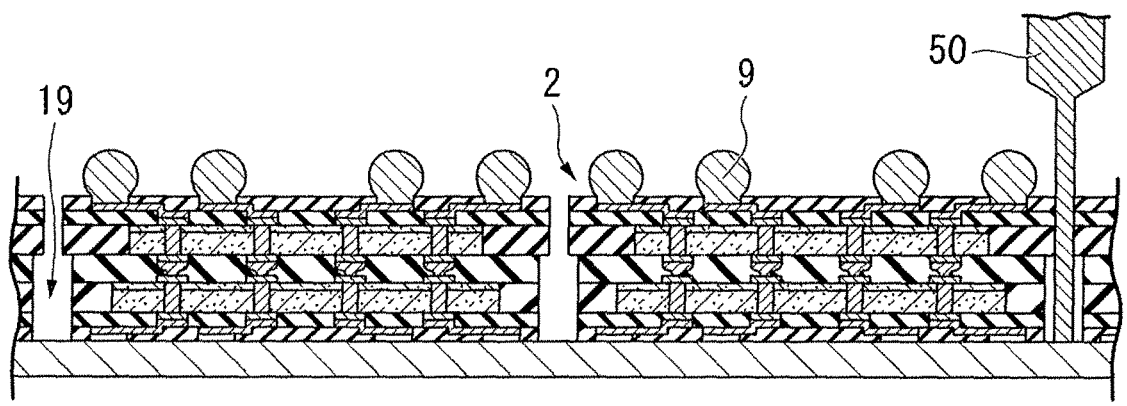
Figure 12:
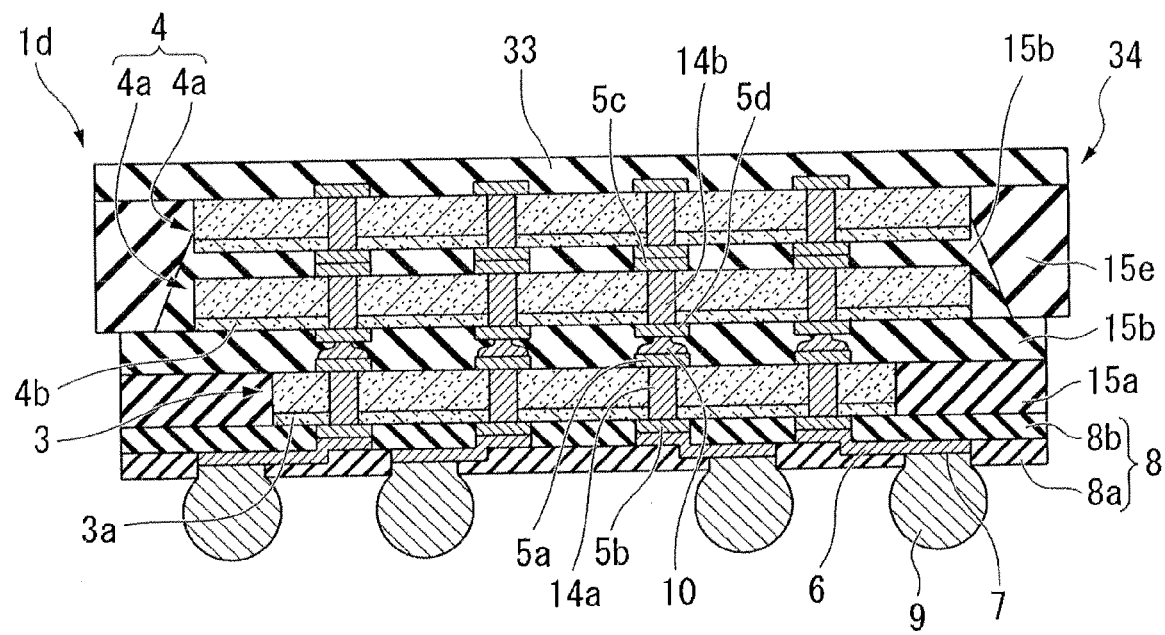
Figure 13:
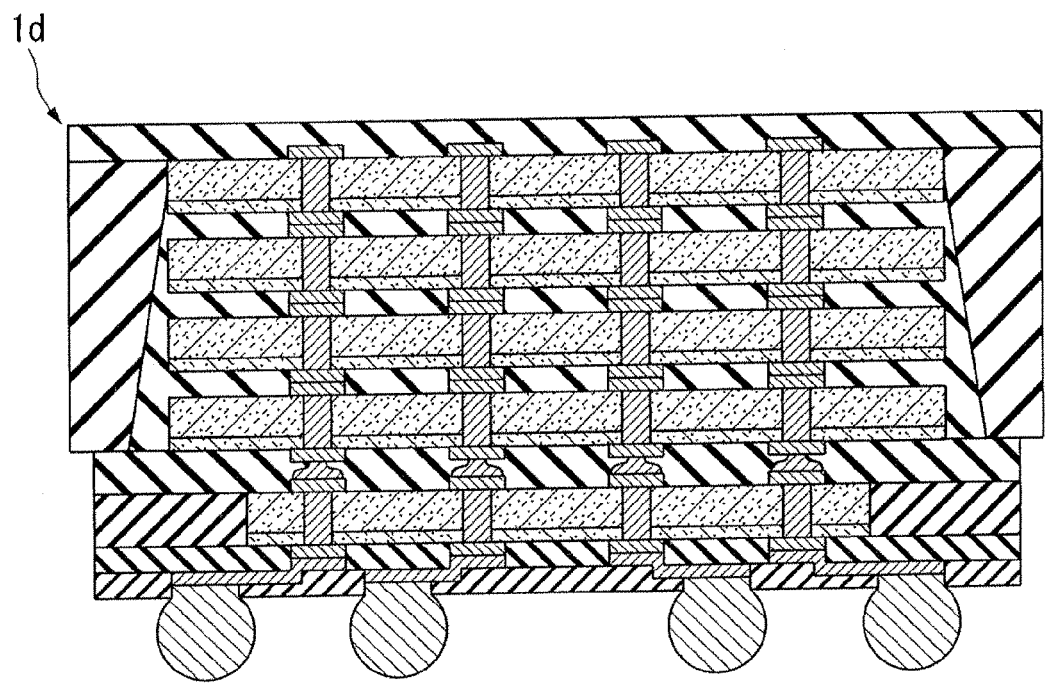
Figure 14A:
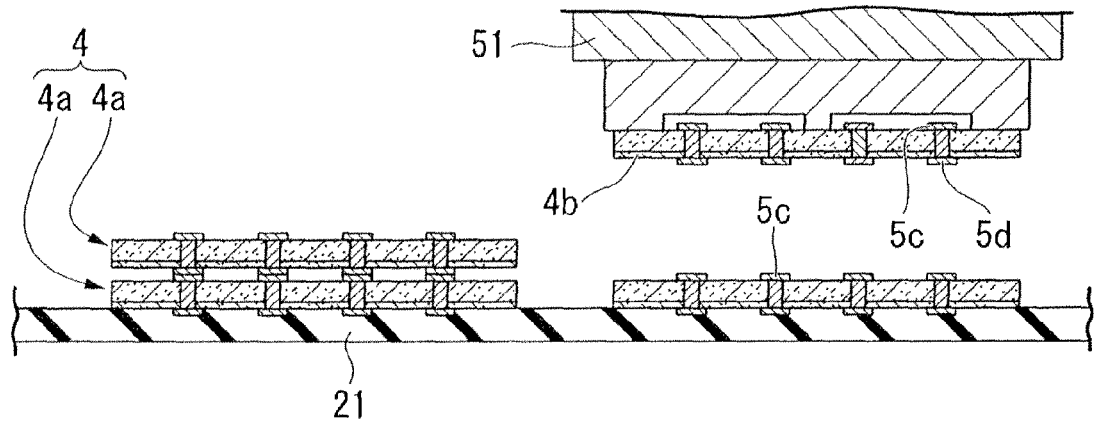
Figure 14B:
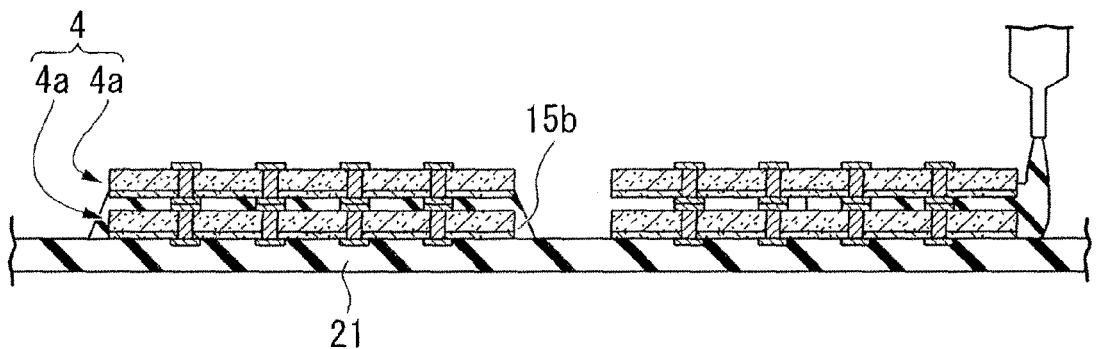
Figure 14C:
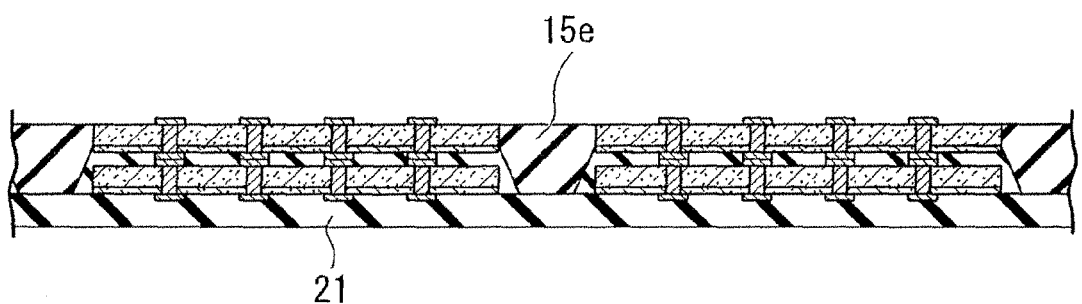
Figure 14D:
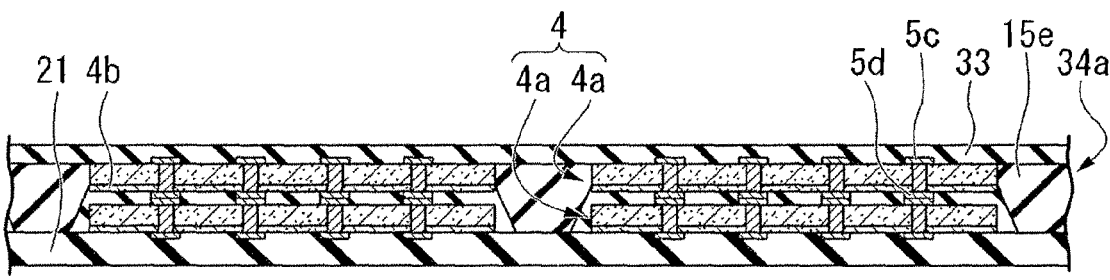
Figure 14E:
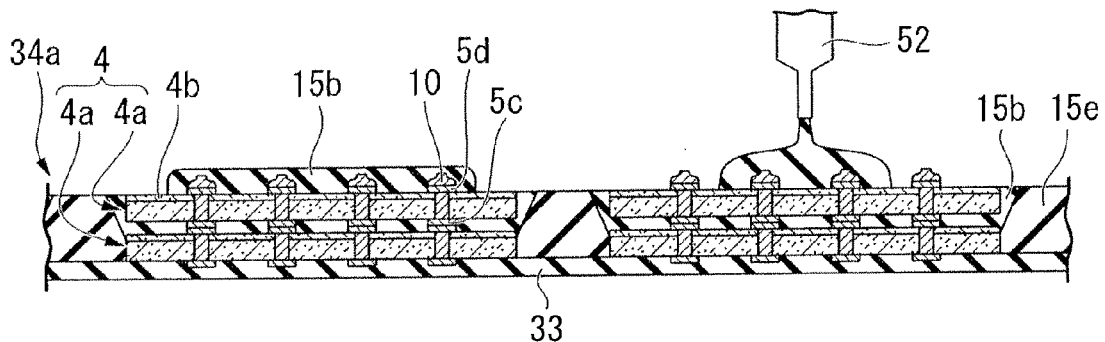
Figure 14F:
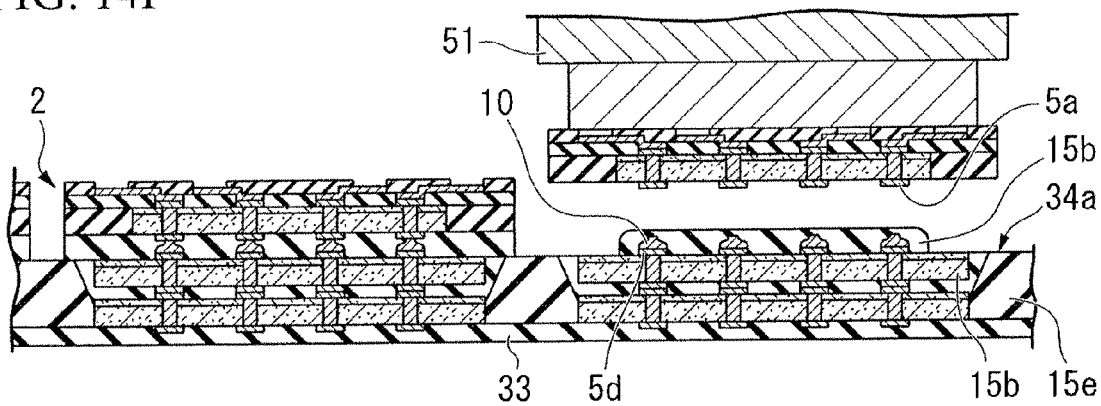
Figure 14G:
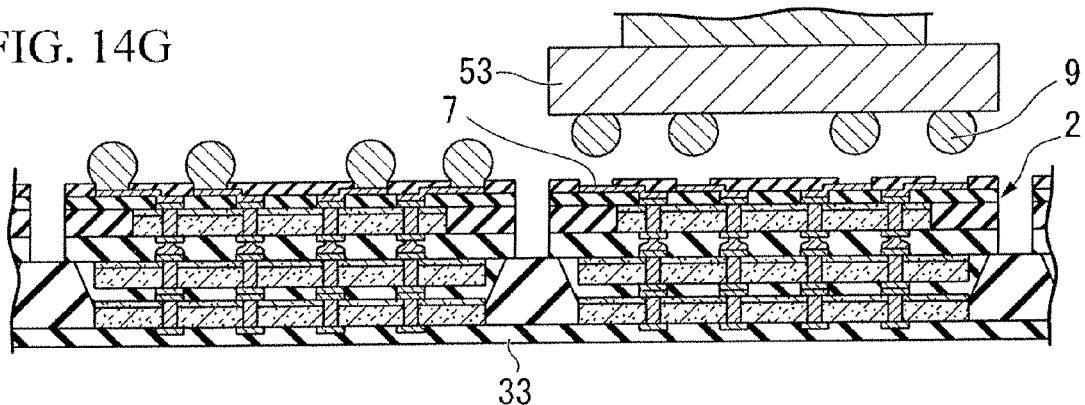
Figure 14H:
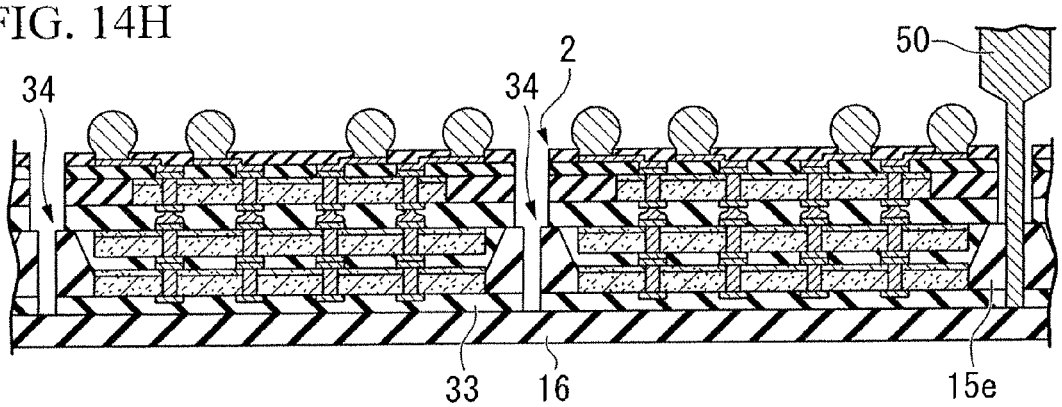

4C, involved in the method of manufacturing the semiconductor device of FIGS. 1 and 2 in accordance with the first embodiment of the present invention;

FIG. 4E is a cross-sectional elevational view illustrating a semiconductor device in a step, subsequent to the step of FIG. 4D, involved in the method of manufacturing the semiconductor device of FIGS. 1 and 2 in accordance with the first embodiment of the present invention;

FIG. 4F is a cross-sectional elevational view illustrating a semiconductor device in a step, subsequent to the step of FIG. 4E, involved in the method of manufacturing the semiconductor device of FIGS. 1 and 2 in accordance with the first embodiment of the present invention;

FIG. 4G is a cross-sectional elevational view illustrating a semiconductor device in a step, subsequent to the step of FIG. 4F, involved in the method of manufacturing the semiconductor device of FIGS. 1 and 2 in accordance with the first embodiment of the present invention;

FIG. 4H is a cross-sectional elevational view illustrating a semiconductor device in a step, subsequent to the step of FIG. 4G, involved in the method of manufacturing the semiconductor device of FIGS. 1 and 2 in accordance with the first embodiment of the present invention;

FIG. 4I is a cross-sectional elevational view illustrating a semiconductor device in a step, subsequent to the step of FIG. 4H, involved in the method of manufacturing the semiconductor device of FIGS. 1 and 2 in accordance with the first embodiment of the present invention;

FIG. 5 is a cross-sectional elevational view illustrating the schematic structure of the semiconductor device according to the second embodiment of the present invention;

FIG. 6A is a cross-sectional elevational view illustrating a semiconductor device in a step involved in a method of manufacturing the semiconductor device of FIG. 5 in accordance with the second embodiment of the present invention;

FIG. 6B is a cross-sectional elevational view illustrating a semiconductor device in a step, subsequent to the step of FIG. 6A, involved in the method of manufacturing the semiconductor device of FIG. 5 in accordance with the second embodiment of the present invention;

FIG. 6C is a cross-sectional elevational view illustrating a semiconductor device in a step, subsequent to the step of FIG. 6B, involved in the method of manufacturing the semiconductor device of FIG. 5 in accordance with the second embodiment of the present invention;

FIG. 6D is a cross-sectional elevational view illustrating a semiconductor device in a step, subsequent to the step of FIG. 6C, involved in the method of manufacturing the semiconductor device of FIG. 5 in accordance with the second embodiment of the present invention;

FIG. 6E is a cross-sectional elevational view illustrating a semiconductor device in a step, subsequent to the step of FIG. 6D, involved in the method of manufacturing the semiconductor device of FIG. 5 in accordance with the second embodiment of the present invention;

FIG. 7 is a plan view illustrating a configuration of a support board used for manufacturing the semiconductor device of FIG. 5 in accordance with the second embodiment of the present invention;

FIG. 8A is a cross-sectional elevational view illustrating a chip-stacked structure including semiconductor devices in a step, subsequent to the step of FIG. 6E, involved in the method of manufacturing the chip-stacked structure in accordance with the second embodiment of the present invention;

FIG. 8B is a cross-sectional elevational view illustrating a chip-stacked structure including semiconductor devices in a step, subsequent to the step of FIG. 8A, involved in the method of manufacturing the chip-stacked structure in accordance with the second embodiment of the present invention;

FIG. 8C is a cross-sectional elevational view illustrating a chip-stacked structure including semiconductor devices in a step, subsequent to the step of FIG. 8B, involved in the method of manufacturing the chip-stacked structure in accordance with the second embodiment of the present invention;

FIG. 8D is a cross-sectional elevational view illustrating a chip-stacked structure including semiconductor devices in a step, subsequent to the step of FIG. 8C, involved in the method of manufacturing the chip-stacked structure in accordance with the second embodiment of the present invention;

FIG. 8E is a cross-sectional elevational view illustrating a chip-stacked structure including semiconductor devices in a step, subsequent to the step of FIG. 8D, involved in the method of manufacturing the chip-stacked structure in accordance with the second embodiment of the present invention;

FIG. 8F is a cross-sectional elevational view illustrating a chip-stacked structure including semiconductor devices in a step, subsequent to the step of FIG. 8E, involved in the method of manufacturing the chip-stacked structure in accordance with the second embodiment of the present invention;

FIG. 8G is a cross-sectional elevational view illustrating a chip-stacked structure including semiconductor devices in a step, subsequent to the step of FIG. 8F, involved in the method of manufacturing the chip-stacked structure in accordance with the second embodiment of the present invention;

FIG. 9 is a cross-sectional elevational view illustrating a semiconductor device 1c in a step involved in a method of forming a semiconductor device assembly according to the third embodiment of the present invention;

FIG. 10 is a cross-sectional elevational view illustrating a semiconductor device in a step, subsequent to the step of FIG. 9, involved in a method of forming a semiconductor device assembly according to the third embodiment of the present invention;

FIG. 11A is a cross-sectional elevational view illustrating a chip-stacked structure including semiconductor devices in a step involved in the method of manufacturing the chip-stacked structure in accordance with the third embodiment of the present invention;

FIG. 11B is a cross-sectional elevational view illustrating a chip-stacked structure including semiconductor devices in a step, subsequent to the step of FIG. 11A, involved in the method of manufacturing the chip-stacked structure in accordance with the third embodiment of the present invention;

FIG. 11C is a cross-sectional elevational view illustrating a chip-stacked structure including semiconductor devices in a step, subsequent to the step of FIG. 11B, involved in the method of manufacturing the chip-stacked structure in accordance with the third embodiment of the present invention;

FIG. 11D is a cross-sectional elevational view illustrating a chip-stacked structure including semiconductor devices in a step, subsequent to the step of FIG. 11C, involved in the method of manufacturing the chip-stacked structure in accordance with the third embodiment of the present invention;

FIG. 11E is a cross-sectional elevational view illustrating a chip-stacked structure including semiconductor devices in a step, subsequent to the step of FIG. 11D, involved in the method of manufacturing the chip-stacked structure in accordance with the third embodiment of the present invention;

FIG. 12 is a cross-sectional elevational view illustrating a structure of the semiconductor device 1d according to the fourth embodiment of the present invention;

FIG. 13 is a cross-sectional elevational view illustrating an example of the case where the number of stacked second semiconductor chips of the semiconductor device 1d of FIG. 12 is increased;

FIG. 14A is a cross-sectional elevational view illustrating a semiconductor device in a step involved in a method of manufacturing the semiconductor device of FIGS. 12 and 13 in accordance with the fourth embodiment of the present invention;

FIG. 14B is a cross-sectional elevational view illustrating a semiconductor device in a step, subsequent to the step of FIG. 14A, involved in the method of manufacturing the semiconductor device of FIGS. 12 and 13 in accordance with the fourth embodiment of the present invention;

FIG. 14C is a cross-sectional elevational view illustrating a semiconductor device in a step, subsequent to the step of FIG. 14B, involved in the method of manufacturing the semiconductor device of FIGS. 12 and 13 in accordance with the fourth embodiment of the present invention;

FIG. 14D is a cross-sectional elevational view illustrating a semiconductor device in a step, subsequent to the step of FIG. 14C, involved in the method of manufacturing the semiconductor device of FIGS. 12 and 13 in accordance with the fourth embodiment of the present invention;

FIG. 14E is a cross-sectional elevational view illustrating a semiconductor device in a step, subsequent to the step of FIG. 14D, involved in the method of manufacturing the semiconductor device of FIGS. 12 and 13 in accordance with the fourth embodiment of the present invention;

FIG. 14F is a cross-sectional elevational view illustrating a semiconductor device in a step, subsequent to the step of FIG. 14E, involved in the method of manufacturing the semiconductor device of FIGS. 12 and 13 in accordance with the fourth embodiment of the present invention;

FIG. 14G is a cross-sectional elevational view illustrating a semiconductor device in a step, subsequent to the step of FIG. 14F, involved in the method of manufacturing the semiconductor device of FIGS. 12 and 13 in accordance with the fourth embodiment of the present invention; and FIG. 14H is a cross-sectional elevational view illustrating a semiconductor device in a step, subsequent to the step of FIG. 14G, involved in the method of manufacturing the semiconductor device of FIGS. 12 and 13 in accordance with the fourth embodiment of the present invention.

DETAILED DESCRIPTION OF THE PREFERRED EMBODIMENTS

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a first wiring board, a second semiconductor chip, and a second seal. The first wiring board may include, but is not limited to, a first substrate, a first semiconductor chip, and a first seal. The first semiconductor chip may be disposed on the first substrate. The first seal may be disposed on the first substrate. The first seal may surround the first semiconductor chip. The first seal has the same thickness as the first semiconductor chip. The second semiconductor chip is stacked over the first semiconductor chip. The first semiconductor chip is between the second semiconductor chip and the first substrate. The second semiconductor chip is greater in size in plan view than the first semiconductor chip. The second seal seals at least a first gap between the first semiconductor chip and the second semiconductor chip.

In some cases, the semiconductor device may include, but is not limited to, a third semiconductor chip that is stacked over the second semiconductor chip. The second semiconductor chip may be between the first semiconductor chip and the third semiconductor chip.

In some cases, the second seal may seal the first gap, a second gap between the second and third semiconductor chips, and at least the side edge of the second semiconductor chip.

In some cases, the semiconductor device may include, but is not limited to, a third seal that covers the second seal.

In some cases, the semiconductor device may include, but is not limited to, a third seal that seals a second gap between the second and third semiconductor chips, and at least the side edge of the second semiconductor chip. The second seal seals the first gap.

In some cases, the semiconductor device may include, but is not limited to, a supporting substrate adhered to the third semiconductor chip.

In some cases, the semiconductor device may include, but is not limited to, a third seal disposed on the second seal. The third seal surrounds the second semiconductor chip. The third seal has the same thickness as the second semiconductor chip.

In some cases, the semiconductor device may include, but is not limited to, a second wiring board that may include, but is not limited to, a second substrate, the second semiconductor chip, and the third seal. The second semiconductor chip may be disposed on the second substrate. The third seal may be disposed on the second substrate. The third seal surrounds the second semiconductor chip. The second seal has the same thickness as the second semiconductor chip.

In some cases, the semiconductor device may include, but is not limited to, a third wiring board, and an insulating film. The third wiring board may include, but is not limited to, the second seal, and a fifth seal that covers the second seal. The insulating film covers the third wiring board.

In another embodiment, a semiconductor device may include, but is not limited to, a first wiring board, and a second semiconductor chip. The first wiring board may include, but is not limited to, a first semiconductor chip and a first seal. The first seal seals a periphery of the first semiconductor chip. The first semiconductor chip and the first seal form a planar structure. The second semiconductor chip may be stacked over the first semiconductor chip. The second semiconductor chip may be greater in size in plan view than the first semiconductor chip.

In some cases, the first semiconductor chip may be within an inside space of the first wiring board.

In some cases, the first wiring board may further include, but is not limited to, a first substrate on which the first semiconductor chip and the first seal are disposed. The first seal surrounds the first semiconductor chip. The first seal has the same thickness as the first semiconductor chip.

In some cases, the semiconductor device may include, but is not limited to, a second seal that seals at least a first gap between the first semiconductor chip and the second semiconductor chip.

In some cases, the semiconductor device may include, but is not limited to, a third semiconductor chip stacked over the second semiconductor chip. The second semiconductor chip is between the first semiconductor chip and the third semiconductor chip.

In some cases, the second seal seals the first gap, a second gap between the second and third semiconductor chips, and at least the side edge of the second semiconductor chip.

In some cases, the semiconductor device may include, but is not limited to, a third seal that seals a second gap between the second and third semiconductor chips, and at least the side edge of the second semiconductor chip, wherein the second seal seals the first gap.

In still another embodiment, a semiconductor module may include, but is not limited to, a first semiconductor device and a second semiconductor device. The second semiconductor device may include, but is not limited to, a single semiconductor chip. The first semiconductor device may include, but is not limited to, a first wiring board, a second semiconductor chip, and a second seal. The first wiring board may include, but is not limited to, a first substrate, a first semiconductor chip, and a first seal. The first semiconductor chip is disposed on the first substrate. The first seal may be disposed on the first substrate. The first seal surrounds the first semiconductor chip. The first seal has the same thickness as the first semiconductor chip. The second semiconductor chip may be stacked over the first semiconductor chip. The first semiconductor chip may be between the second semiconductor chip and the first substrate. The second semiconductor chip is greater in size in plan view than the first semiconductor chip. The second seal seals at least a first gap between the first semiconductor chip and the second semiconductor chip.

In some cases, the semiconductor module may include, but is not limited to, a board, wherein the first semiconductor device is disposed on the board, and the second semiconductor device is disposed on the board.

In some cases, the semiconductor module may include, but is not limited to, a board, wherein the first semiconductor device is disposed over the board, and the second semiconductor device is disposed over the first semiconductor device. The first semiconductor device is between the board and the second semiconductor device.

In yet another embodiment, a method of forming a semiconductor device may include, but is not limited to, the following processes. A first seal is formed which seals a periphery of a first semiconductor chip. The first seal has the same thickness of the first semiconductor chip. A first substrate is placed which covers the first semiconductor chip and the first seal to form a first wiring board. A second semiconductor chip is stacked over the first semiconductor chip. The second semiconductor chip is greater in size in plan view than the first semiconductor chip. The first semiconductor chip is between the second semiconductor chip and the first substrate. A second seal is formed which seals at least a first gap between the first semiconductor chip and the second semiconductor chip.

In some cases, the method may include, but is not limited to, the following process. A third semiconductor chip is stacked over the second semiconductor chip. The second semiconductor chip is between the first semiconductor chip and the third semiconductor chip.

In some cases, the second seal may be formed which seals the first gap, a second gap between the second and third semiconductor chips, and at least the side edge of the second semiconductor chip.

In some cases, the method may include, but is not limited to, the following process. A third seal may be formed which covers the second seal.

In some cases, the method may include, but is not limited to, the following process. A third seal may be formed which seals a second gap between the second and third semiconductor chips, and at least the side edge of the second semiconductor chip.

In some cases, the method may include, but is not limited to, the following process. A fourth seal may be formed which covers the third seal.

In some cases, the method may include, but is not limited to, the following process. A supporting substrate may be formed which is adhered to the third semiconductor chip.

In some cases, the method may include, but is not limited to, the following process. A third seal may be formed on the second seal. The third seal surrounds the second semiconductor chip. The third seal has the same thickness as the second semiconductor chip.

In some cases, the method may include, but is not limited to, the following process. A second wiring board may be formed by forming a second substrate, forming the second semiconductor chip on the second substrate, and forming the third seal on the second substrate. The third seal surrounds the second semiconductor chip. The second seal has the same thickness as the second semiconductor chip.

In some cases, the method may include, but is not limited to, the following processes. A third wiring board is formed. An insulating film is formed, which covers the third wiring board. The third wiring board may be formed by forming the second seal, and forming a fifth seal that covers the second seal.

Hereinafter, a semiconductor device 1a according to a first embodiment of the present invention will be described in detail with reference to the accompanying drawings.

FIG. 1 is a schematic cross-sectional elevational view illustrating a CoC semiconductor device according to a first embodiment of the present invention. FIG. 2 is a cross-sectional elevational view illustrating an example of an electronic device in which the semiconductor device of FIG. 1 is mounted.

The semiconductor device 1a of the present embodiment is a Ball Grid Array (BGA) semiconductor device. The semiconductor device 1a may include, but is not limited to, a first wiring board 2, a chip-stacked structure 4, a second seal 15b, and a third seal 15c. The first wiring board 2 may include a first semiconductor chip 3 mounted therein. The first wiring board 2 may have a substantially rectangular shape in plan view. The chip-stacked structure 4 may include second semiconductor chips 4a. The chip-stacked structure 4 may be disposed over the first wiring board 2. The second seal 15b seals the gaps between the second semiconductor chips 4a. The third seal 15c covers the second seal 15b and one surface of the first wiring board 2.

First Wiring Board 2:

The first wiring board 2 may have a substantially rectangular shape in plan view. The first wiring board 2 may have a thickness of about 80 μm. The first wiring board 2 may include the first semiconductor chip 3, first bump electrodes 5a and 5b, a first seal 15a, and a first base 11. The first wiring board 2 may further include first rewiring layers 6, a first insulating layer 8, and first lands 7.

The first semiconductor chip 3 may include, for example, a board of Si or the like. The first semiconductor chip 3 may have a substantially rectangular shape in plan view. The first semiconductor chip 3 may have a thickness of 50 μm. The first semiconductor chip 3 may have an interface circuit (first circuit forming surface 3a) disposed on the other surface when viewed from the first wiring board 2. The first semiconductor chip is smaller in plan view than that of the second semiconductor chip 4a.

In the first semiconductor chip 3, a semiconductor chip may be capable of achieving interface connection with an external terminal, for example, an interface chip.

On both one and other surfaces of the first semiconductor chip 3, a plurality of first cylindrical bump electrodes 5a and 5b are formed. Corresponding ones of the first bump electrodes 5a and 5b are electrically connected via first through electrodes 14a.

The first seal 15a may have the same thickness as the first semiconductor chip 3. The first seal 15a may be formed so that the first seal 15a may surround the periphery of the first semiconductor chip 3. The one surface and the other surface of the first semiconductor chip 3 are exposed. The first seal 15a may have a substantially a rectangular plate shape in which the first semiconductor chip 3 is mounted.

The first base 11 may include the first rewiring layers 6, the first insulating layer 8 and the first lands 7.

Each first rewiring layer 6 may be formed of Cu. Each first rewiring layer 6 may be formed on the other surface of the first semiconductor chip 3 and the first seal 15a. The first insulating layer 8 may have a multi-layered structure of a first insulating layer 8a and a second insulating layer 8b. The first insulating layer 8 may be formed so as to cover the other surface of the first semiconductor chip 3 and the first seal 15a and the first rewiring layers 6. A plurality of first lands 7 may be formed on exposed portions of the first rewiring layers 6, wherein the exposed portions are exposed from the first insulating layer 8.

The first lands 7 may be formed of Cu. The first lands 7 may be electrically connected to corresponding ones of the first bump electrodes 5b by the first rewiring layers 6. The plurality of first lands 7 may be arranged in matrix on the other surface of the first insulating layer 8. The plurality of first lands 7 may have a distance from each other at a predetermined interval, for example, at an interval of 0.8 mm. Soldering balls 9, which perform as the external terminals of the semiconductor device 1a, are respectively mounted on the outer surfaces thereof.

Chip-Stacked Structure 4:

The chip-stacked structure 4 may be disposed on one surface of the first semiconductor chip 3, so that the chip-stacked structure 4 may be spaced apart from the first semiconductor chip 3. The chip-stacked structure 4 may be configured by stacking second semiconductor chips 4a as a memory chip. Each second semiconductor chip 4a may have a substantially rectangular board made of Si or the like. A memory circuit (a second circuit forming surface 4b) may be formed on the other surface of the second semiconductor chip 4a when viewed from the first wiring board 2. The second semiconductor chip 4a may be in plan view greater than the first semiconductor chip 3. The second semiconductor chip 4a may have a thickness of about 50 μm.

A plurality of second bump electrodes 5c and 5d may be disposed on one surface and the other surface of each of the second semiconductor chips 4a, respectively. The plurality of second bump electrodes 5c on the one surface of the second semiconductor chips 4a may be electrically connected to the second bump electrodes 5d of the other surface of the second semiconductor chips 4a through the second through electrodes 14b, respectively.

Second Seal 15b and Third Seal 15c:

The second seal 15b of the present embodiment may be formed of, for example, an underfill material. The underfill material fills a gap between the first wiring board 2 and the lower one of the second semiconductor chip 4a and a gap between the second semiconductor chips 4a of the chip-stacked structure 4. The second seal 15b surrounds the chip-stacked structure 4.

The third seal 15c may, for example, be formed of a thermosetting resin such as epoxy resins. The third seal 15c covers one surface of the first wiring board 2, the second seal 15b and the chip-stacked structure 4.

According to the semiconductor device 1a of the present embodiment, the first seal 15a may be formed on the periphery of the first semiconductor chip 3 with the same thickness as the first semiconductor chip 3. The first semiconductor chip 3 is mounted on the first wiring board 2. By this configuration, it is possible to realize dimensional-reduction of the semiconductor device 1a and improvement of electrical characteristics while maintaining high functions.

In addition, the first lands 7 can be disposed on the other surface of the first seal 15a as well as the first semiconductor chip 3. Soldering balls 9 can be mounted on the first wiring board 2 and thus the number of pins of the semiconductor device 1a can be increased.

FIG. 2 is a cross-sectional elevational view illustrating the semiconductor device 1a integrated in an electronic device such as a memory module in accordance with the present embodiment.

Achieving dimensional-reduction of the semiconductor device 1a of the present embodiment, as shown in FIG. 2 will result in achieving dimensional-reduction of an electronic device or a memory module 41 that includes an integration of the semiconductor device 1a and a semiconductor device 40 for controlling the semiconductor device 1a.

A method of manufacturing the semiconductor device 1a of the present embodiment will be described.

Figure 3A:
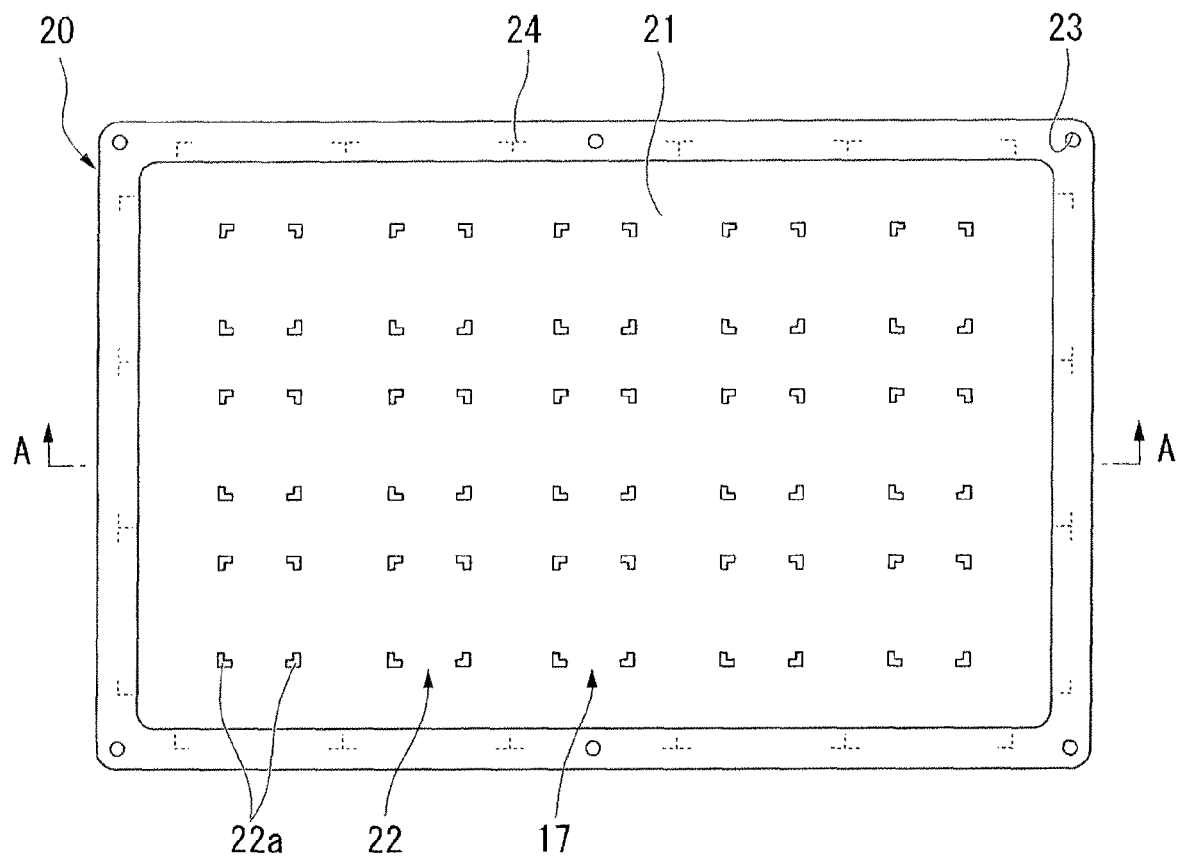
FIG. 3A is a plan view illustrating a schematic configuration of a frame used to manufacture the semiconductor device of FIGS. 1 and 2 in accordance with the first embodiment of the present invention.
Figure 3B:
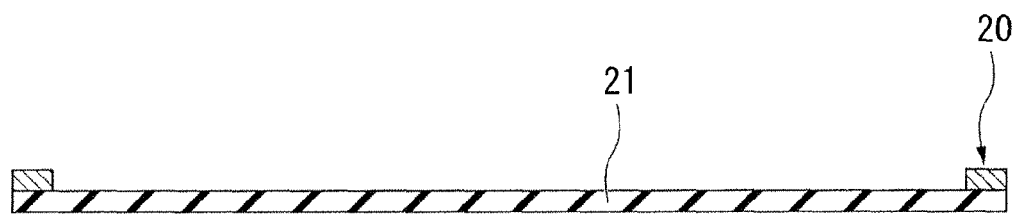
FIG. 3B is a cross-sectional elevational view illustrating the schematic configuration of FIG. 3A.

FIG. 3A is a plan view illustrating a schematic configuration of a frame 20 used to manufacture the semiconductor device 1a of FIGS. 1 and 2 in accordance with the first embodiment of the present invention. FIG. 3B is a cross-sectional elevational view illustrating the schematic configuration of FIG. 3A. FIG. 4A to FIG. 4I are cross-sectional elevational views illustrating a method of manufacturing the semiconductor device 1a of the first embodiment of the present invention.

The method of manufacturing the semiconductor device 1a of the present embodiment schematically may include, but is not limited to, the steps of preparing the frame 20, forming a first wiring mother board 2a formed of the first wiring boards 2, forming the chip-stacked structure 4, forming the second seal 15b, forming the third seal 15c, mounting the soldering balls 9, and dividing the first wiring mother board 2a into the first wiring boards 2. Hereinafter, each step will be sequentially described.

Preparing Frame 20:

First, the frame 20 having a frame shape is prepared. FIG. 3A is a plan view of the frame 20 and FIG. 3B is a cross-sectional elevational view taken along line A-A' of FIG. 3A.

The frame 20 is, for example, formed of SUS or the like. The frame 20 has the frame shape. On one surface of the frame 20, a support 21 formed of, for example, an adhesion tape is adhered in a state in which an adhesion portion faces the other surface. On the other surface of the support 21, a plurality of first product formation portions 17 is arranged in a matrix, and first chip mount portions 22 formed of first chip mounting marks 22a are formed on the central portions thereof.

In the frame 20, a plurality of first positioning holes 23 is formed at a predetermined interval such that the frame 20 is transported and positioned. In addition, on the other surface of a frame portion of the frame 20, positioning marks 24 of first dicing lines 25 are formed.

Forming First Wiring Mother Board 2a:

The step of forming the first wiring mother board 2a formed of the first wiring boards 2 includes steps of mounting the first semiconductor chip 3 in each of the first chip mount portions 22, forming the first seal 15a, forming the first base 11 (the first rewiring layers 6, the first insulating layer 8 and the first lands 7), and removing the support 21. Hereinafter, each step will be sequentially described.

Mounting First Semiconductor Chip 3:

First, as shown in FIG. 4A, one surface of the first semiconductor chip 3 is adhered to each of the first chip mount portions 22. By this configuration, the first semiconductor chips 3 are disposed on the support 21 in a matrix in a state in which the first circuit forming surfaces 3a are exposed.

Forming First Seal 15a:

As shown in FIG. 4B, the first seal 15a is formed.

First, liquid seal resin, for example, epoxy resin is dropped on the support 21 on the inner side of the frame shape of the frame 20 by a potting device (not shown) or the like. At this time, the seal resin (the first seal 15a) is filled so as not to cover the first circuit forming surface 3a of the first semiconductor chip 3 and so as to have the same thickness as the first semiconductor chip 3. The seal resin (the first seal 15a) is cured at about 150° C. Thus, the seal resin (the first seal 15a) is thermally cured so as to form the first seal 15a.

Forming First Base 11:

As shown in FIG. 4C, the first base 11 including the first rewiring layers 6, the first insulating layer 8 and the first lands 7 is formed.

First, the first layer 8a of the first insulating layer is formed on the other surface of the first semiconductor chip 3 and the first seal 15a using a photolithography technique, an etching technique or the like so as to cover a region excluding the first bump electrodes 5b of the other surface of the first semiconductor chip 3 and the other surface of the first seal 15a. The first rewiring layers 6 are formed to extend from the first bump electrodes 5a and the first lands 7 are provided in the lattice shape at the predetermined interval such that the first lands 7 and the first bump electrodes 5b are electrically connected. The second layer 8b of the first insulating layer is formed so as to cover a region excluding the first lands 7 of the other surface of the first layer 8a of the first insulating layer.

Removing Support 21:

As shown in FIG. 4D, the support 21 is removed. By this operation, the first wiring mother board 2a in which the plurality of first semiconductor chips 3 is mounted is formed. The first wiring mother board 2a is cut and divided by the first dicing lines 25 in subsequent steps so as to form the first wiring board 2.

Forming Chip-Stacked Structure 4:

As shown in FIG. 4E, the chip-stacked structure 4 is formed.

First, the first wiring mother board 2a is prepared. The first wiring mother board 2a is held and fixed on a flip-chip bonder stage (not shown), and an opposite side of the second circuit forming surface 4b of the second semiconductor chip 4a is sucked and held by a bonding tool 51. At this time, the second semiconductor chip 4a having the size in plan view greater than that of the first semiconductor chip 3 is used.

The second bump electrodes 5d of the second semiconductor chip 4a are mounted so as to correspond to the positions of the first bump electrodes 5a of the first semiconductor chip 3 and a load is applied to both the bump electrodes at a high temperature, for example, about 300° C. By this operation, flip chip bonding is performed and the first bump electrodes 5a and the second bump electrodes 5d are electrically bonded.

Even in the case where a plurality of second semiconductor chips 4a is present, similarly, on one surface of a second semiconductor chip 4a, the other second semiconductor chips 4a are sequentially stacked such that the second circuit forming surfaces face the other surface. At this time, the bonding of the second bump electrodes 5d and the second bump electrodes 5c may be performed by applying ultrasonic waves as well as the load. By stacking the plurality of second semiconductor chips 4a, it is possible to increase the capacity of the semiconductor device 1a.

Forming Second Seal 15b:

As shown in FIG. 4F, the second seal 15b is formed.

First, the second liquid seal 15b is supplied to the position near the end of the chip-stacked structure 4 by a dispenser 52 of a coater. At this time, the second seal 15b is not disposed on one surface of the chip-stacked structure 4. The second seal 15b supplied to the position near the end of the chip-stacked structure 4 surrounds the periphery of the chip-stacked structure 4 so as to be filled in a gap between the first wiring mother board 2a and the second semiconductor chip 4a and the second semiconductor chips 4a of the chip-stacked structure 4 by capillarity. At this time, the second seal 15b surrounding the periphery of the chip-stacked structure 4 is mostly held on the other surface (the side of the first wiring mother board 2a) of the chip-stacked structure 4 by gravity, and the cross section thereof has a trapezoidal shape.

At this time, the first semiconductor chip 3 surrounds the periphery of the first seal 15a having the same thickness such that the first semiconductor chip 3 is integrally formed with the first wiring board 2. Therefore, it is possible to prevent influence of displacement between the end of the first semiconductor chip 3 and the second semiconductor chip 4a and to suppress generation of a void in the second seal 15b between the first semiconductor chip 3 and the second semiconductor chip 4a.

After the supply of the underfill material (the second seal 15b) to the chip-stacked structure 4 is finished, the chip-stacked structure 4 is cured at a predetermined temperature, for example, about 150° C. Thus, the underfill material (the second seal 15b) is thermally cured so as to form the second seal 15b.

Forming Third Seal 15c:

As shown in FIG. 4G, the third seal 15c is formed.

First, the first wiring mother board 2a is formed by a mold formed of an upper mold and a lower mold of a transfer mold device (not shown). In the upper mold of the transfer mold device, a cavity (an internal space of the mold) is formed so as to collectively cover the plurality of chip-stacked structure 4, and the chip-stacked structure 4 and the second seal 15b positioned on one surface of the first wiring mother board 2a are disposed in the cavity by clamping.

A melted seal resin (third seal 15c) is injected from a gate portion formed in the upper mold of the mold device into the cavity. In the third seal 15c, for example, thermosetting resin such as epoxy resin is used.

Curing is performed at a predetermined temperature, for example, about 180° C. in a state in which the seal resin (the third seal 15c) is filled in the cavity. Thus, the seal resin (the third seal 15c) is thermally cured so as to form the third seal 15c collectively covering one surface of the first wiring mother board 2a and the plurality of second seals 15b. At this time, the second seal 15b is previously filled in the gap between the first wiring mother board 2a and the second semiconductor chip 4a and the gap between the stacked second semiconductor chips 4a, thereby preventing the void from being generated between the second semiconductor chips 4a.

Thereafter, the first wiring mother board 2a is baked at a predetermined temperature so as to completely cure the third seal 15c.

Mounting Soldering Balls 9:

As shown in FIG. 4H, the step progresses to a ball mount step, in which the soldering balls 9 are mounted on the other surface of the first lands 7.

First, conductive metal balls, for example, the soldering balls 9 are sucked and held so as to be matched to the positions of the plurality of first lands 7 using a mount tool 53 of a ball mounter (not shown) in which a plurality of suction holes are formed. A flux is transferred and formed on the sucked and held soldering balls 9 so as to be collectively mounted on the other surface of the plurality of first lands 7. After the soldering balls 9 are mounted on all the first lands 7, the first wiring mother board 2a is reflowed so as to adhere the soldering balls 9 to the first lands 7, thereby forming the bump electrodes (soldering balls 9). The bump electrodes (soldering balls 9) perform as the external terminal.

Dividing First Wiring Mother Board 2a into First Wiring Boards 2:

As shown in FIG. 4I, the method progresses to a board dicing step, in which the first wiring mother board 2a is divided into the first wiring boards 2.

First, one surface (the side of the third seal 15c) of the first wiring mother board 2a is attached and supported to a dicing tape 16. The first wiring mother board 2a is horizontally and vertically cut by a dicing blade 50 along first dicing lines 25 so as to be divided in units of first product formation portions 17. At this time, since the third seal 15c is formed on one surface of the first wiring mother board 2a, the first dicing lines 25 cannot be recognized. However, since positioning marks 24 are formed on the frame portion of the frame 20, the recognition of cut positions and the cut and separation of first product formation portions 17 are possible. Thereafter, the third seal 15c is picked up from the dicing tape 16 so as to obtain the semiconductor device 1a shown in FIG. 1.

According to the method of manufacturing the semiconductor device 1a of the present embodiment, the first seal 15a is formed so as to surround the periphery of the first semiconductor chip 3 and the second seal 15b is formed so as to cover the first semiconductor chip 3. Accordingly, it is possible to reduce warpage of the semiconductor device 1a due to a difference in thermal expansion between the first wiring board 2 and the first semiconductor chip 3, as compared with the case where the glass epoxy wiring board of the related art is used.

Accordingly, the soldering balls 9 can be collectively mounted on all the first lands 7 of the first wiring mother board 2a and dicing accuracy can be improved. Therefore, it is possible to form the semiconductor device 1a with high manufacture efficiency.

Since the first semiconductor chip 3 having a size in plan view less than that of the second semiconductor chip 4a is mounted on the first wiring board 2, it is possible to suppress influence clue to a step difference between the stacked first semiconductor chip 3 and second semiconductor chip 4a. Accordingly, when the second seal 15b is filled, it is possible to reduce a void generated between the first semiconductor chip 3 and the second semiconductor chip 4a so as to improve reliability of the semiconductor device 1a. Therefore, it is possible to realize dimensional-reduction and large capacity of the semiconductor device 1a.

Second Embodiment

Hereinafter, a semiconductor device 1b according to a second embodiment of the present invention will be described with reference to the drawings.

FIG. 5 is a cross-sectional elevational view illustrating the schematic structure of the semiconductor device 1b according to the second embodiment of the present invention. In addition, in the drawings used in the following description, for convenience, characteristic parts are enlarged in order to easily recognize characteristics and thus dimensional ratios of components is not limited to be equal to those of actual components.

The semiconductor device 1b of the present embodiment is a BGA semiconductor device which schematically includes a first wiring board 2 having a first semiconductor chip 3 mounted therein and having a substantially rectangular shape in plan view, a second seal 15b disposed on one surface of the first wiring board 2, a chip-stacked structure 4 disposed on one surface of the second seal 15b and including second semiconductor chips 4a, a second seal 15b formed between the second semiconductor chips 4a of the chip-stacked structure 4 and on the periphery of the chip-stacked structure 4, a third seal 15c surrounding the periphery of the second seal 15b, and a supporting substrate 13 disposed on one surface of the chip-stacked structure 4 through an adhesive member 12.

First Wiring Board 2:

The first wiring board 2 has a substantially rectangular shape in plan view, has a thickness of about 80 μm, and includes the first semiconductor chip 3, first bump electrodes 5a and first bump electrodes 5b, wire bumps 10 connected to the first bump electrodes 5a, a first seal 15a, and a first base 11 (first rewiring layers 6, a first insulating layer 8, and first lands 7).

The first semiconductor chip 3 includes, for example, a board composed of Si or the like and having a substantially rectangular shape in plan view with a thickness of 50 μm, and has an interface circuit (first circuit forming surface 3a) disposed on the other surface when viewed from the first wiring board 2.

On both one surface and the other surface of the first semiconductor chip 3, a plurality of first cylindrical bump electrodes 5a and first bump electrodes 5b are formed. The first bump electrodes 5a and the first bump electrodes 5b corresponding to each other are electrically connected by first through electrodes 14a.

Each of the wire bumps 10 formed of Au or the like is connected to one surface of each of the first bump electrodes 5a, and the first bump electrodes 5a and the below-described second bump electrodes 5d of the other surface of the second semiconductor chip 4a are electrically connected to each other through the wire bumps 10. The wire bumps 10 may be formed of solder instead of Au.

The first seal 15a has the same thickness as the first semiconductor chip 3 and is formed so as to surround the periphery of the first semiconductor chip 3. By this configuration, one surface and the other surface of the first semiconductor chip 3 are exposed so as to have a substantially a rectangular plate configuration in which the first semiconductor chip 3 is mounted.

The first base 11 includes the first rewiring layers 6, the first insulating layer 8 and the first lands 7.

Each first rewiring layer 6 is formed on the other surface of the first semiconductor chip 3 and the first seal 15a. The first insulating layer 8 is formed so as to cover the other surface of the first semiconductor chip 3 and the first seal 15a and the first rewiring layers 6. A plurality of first lands 7 is formed on portions of the first rewiring layers 6 exposed by the first insulating layer 8.

The first lands 7 and the first bump electrodes 5b corresponding thereto are electrically connected by the first rewiring layers 6, respectively. In addition, the plurality of first lands 7 are arranged on the other surface of the first insulating layer 8 in a lattice shape at a predetermined interval, and soldering balls 9 are respectively mounted on the outer surfaces thereof.

Second Seal 15b:

The second seal 15b of the present embodiment is, for example, formed of a Non conductive Paste (NCP) formed of epoxy resin and is formed so as to surround one surface of the first wiring board 2, and the periphery of the first bump electrodes 5a, the wire bumps 10 and the second bump electrodes 5d. The second seal 15b has a substantially rectangular shape and the size in plan view thereof is equal to that of the first wiring board 2.

Chip-Stacked Structure 4:

The chip-stacked structure 4 is configured by stacking the second semiconductor chips 4a on one surface of the second seal 15b. A memory circuit is formed on the other surface of the second semiconductor chip 4a when viewed from the first wiring board 2 so as to configure a second circuit forming surface 4b. The size in plan view of the second semiconductor chip 4a is greater than the size in plan view of the first semiconductor chip 3.

The second circuit forming surface 4b of the second semiconductor chip 4a positioned nearest to the other surface of the chip-stacked structure 4 is sealed by the second seal 15b and the second circuit forming surface 4b of the other second semiconductor chip 4a is sealed by the below-described second seal 15.

A plurality of second bump electrodes 5c and 5d are formed on one surface and the other surface of each of the second semiconductor chips 4a, respectively. The plurality of second bump electrodes 5c formed on one surface are electrically connected to the second bump electrodes 5d of the other surface through the second through electrodes 14b, respectively.

The adhesive member 12 is formed so as to cover one surface of the second semiconductor chip 4a disposed on an uppermost position of one surface of the chip-stacked structure 4. The adhesive member 12 is, for example, formed of a Die Attached Film (DAF) or an NCR Second Seal 15b and Third Seal 15c:

The second seal 15b of the present embodiment is, for example, formed of an underfill material, is filled between the second semiconductor chips 4a of the chip-stacked structure 4, and is formed so as to surround the chip-stacked structure 4 and the adhesive member 12.

The third seal 15c is, for example, formed of thermosetting resin such as epoxy resin and is formed so as to surround the second seal 15b. The outer circumference of the third seal 15c has a substantially rectangular shape and the size in plan view thereof is greater than the size in plan view of the first wiring board 2 and the adhesive member 12.

Supporting Substrate 13:

The supporting substrate 13 is disposed so as to cover the adhesive member 12 and one surface of the second seal 15b and the third seal 15c. The supporting substrate 13 is, for example, formed of 42 alloy of an iron-nickel alloy with a thickness of 0.1 mm and is formed of a substantially rectangular plate-shaped board. In addition, the size in plan view thereof is equal to that of the outer circumference of the third seal 15c.

According to the semiconductor device 1b of the present embodiment, since the first semiconductor chip 3 is mounted on the first wiring board 2, it is possible to realize dimensional-reduction of the semiconductor device 1b and improvement of electrical characteristics. Since the second semiconductor chip 4a can be mounted on the other surface of the first seal 15a as well as the first semiconductor chip 3, it is possible to realize larger capacity of the semiconductor device 1b.

In the present embodiment, since the supporting substrate 13 formed of metal is disposed on one surface of the chip-stacked structure 4, it is possible to efficiently radiate heat generated by the chip-stacked structure 4 from the supporting substrate 13. By this configuration, it is possible to prevent deterioration of the semiconductor device 1b by heat and to improve durability.

A method of manufacturing the semiconductor device 1b of the present embodiment will be described.

FIGS. 6A to 6E, 8A to 8G are cross-sectional elevational views illustrating a method of manufacturing the semiconductor device 1b of the second embodiment of the present invention. FIG. 7 is a plan view illustrating a configuration of a supporting substrate 13 used for manufacturing the semiconductor device 1b of the second embodiment of the present invention.

The method of manufacturing the semiconductor device 1b of the present embodiment schematically may include, but is not limited to, steps forming the first wiring board 2, preparing the supporting substrate 13, forming the chip-stacked structure 4, forming the second seal 15b, forming the third seal 15c, forming the wire bumps 10, applying the second seal 15b, mounting the first wiring board 2, mounting the soldering balls 9, and dividing the third seal 15c and the supporting substrate 13. Hereinafter, each step will be sequentially described, but the description of the same portions as the first embodiment will be omitted.

Forming First Wiring Board 2:

The step of forming the first wiring board 2 includes steps of mounting the first semiconductor chip 3 on each first chip mount portion 22 of a support 21, forming the first seal 15a, forming the first base 11 (the first rewiring layers 6, the first insulating layer 8 and the first lands 7), and dividing the first wiring mother board 2a into the first wiring boards 2. Hereinafter, each step will be sequentially described.

Mounting First Semiconductor Chip 3:

First, a frame 20 shown in FIG. 3A is prepared. The support 21 formed of, for example, an adhesion tape is adhered to one surface of the frame 20 in a state in which an adhesion portion faces the other surface. A plurality of first chip mount portions 22 is arranged on the other surface of the support 21 in a matrix.

As shown in FIG. 6A, one surface of the first semiconductor chip 3 is adhered to each first chip mount portion 22. Accordingly, the first semiconductor chips 3 are arranged on the support 21 in a matrix in a state in which the first circuit forming surfaces 3a are exposed.

Forming First Seal 15a:

As shown in FIG. 6B, the first seal 15a is formed.

First, liquid seal resin (first seal 15a) is dropped on the support 21 and is filled so as to have the same thickness as the first semiconductor chip 3. The seal resin (first seal 15a) is cured so as to form the first seal 15a.

Forming First Base 11:

As shown in FIG. 6C, the first base 11 (the first rewiring layers 6, the first insulating layer 8 and the first lands 7) is formed.

First, the first layer 8a of the first insulating layer is formed on the other surface of the first semiconductor chip 3 and the first seal 15a. The first rewiring layers 6 and the first lands 7 are provided and the second layer 8b of the first insulating layer is formed so as to cover a region excluding the first lands 7. Accordingly, the first wiring mother board 2a is formed.

Dividing First Wiring Mother Board 2a into First Wiring Boards 2:

As shown in FIG. 6D, the method progresses to a board dicing step, in which the first wiring mother board 2a is cut in units of the first product formation portions 17 divided into the first wiring boards 2. Thereafter, as shown in FIG. 5E, the first wiring board 2 is picked up from the support 21.

Preparing Supporting Substrate 13:

First, the supporting substrate 13 is prepared. FIG. 7 is a plan view of the supporting substrate 13.

The supporting substrate 13 is, for example, formed of 42 alloy of an iron-nickel alloy with a thickness of 0.1 mm and the size in plan view thereof is substantially rectangular. The supporting substrate 13 is configured so as to be processed using a Mold Array Process (MAP) method, a plurality of second product formation portions 31 is arranged in a central area thereof in a matrix, and second chip mount portions 26 are respectively formed in central portions thereof. A frame portion 27 is disposed so as to surround the central area on the outside of the second product formation portions 31.

The second chip mount marks 26a are respectively formed in the second chip mount portions 26. A plurality of second positioning holes 28 and cutting marks 30 are formed on the frame portion 27 at a predetermined interval so as to indicate the transport and positioning of the supporting substrate 13 and the positions of second dicing lines 29.

Forming Chip-Stacked Structure 4:

As shown in FIG. 8A, the chip-stacked structure 4 is formed.

First, the adhesive member 12 is adhered and fixed to each of the second chip mount portions 26 of the supporting substrate 13. The adhesive member 12 is, for example, a DAF or NCP.

The second circuit forming surface 4b of the second semiconductor chip 4a is sucked and held by a bonding tool 51 and the second semiconductor chip 4a is mounted on the adhesive member 12. The size in plan view of the second semiconductor chip 4a is greater than that of the first semiconductor chip 3. Next, similarly, another second semiconductor chip 4a is sucked and held by the boding tool 51 and is mounted such that the second bump electrodes 5d and the second bump electrodes 5c are matched to each other, and a load is applied to both the bump electrodes at a high temperature, for example, about 300° C. Accordingly, flip chip bonding is performed and the first bump electrodes 5a and the second bump electrodes 5d are electrically bonded. This bonding may be performed by applying ultrasonic waves as well as the load.

Forming Second Seal 15b:

As shown in FIG. 8B, the second seal 15b is formed.

First, the liquid underfill material (second seal 15b) is supplied to the position near the end of the chip-stacked structure 4 by a dispenser 52 of a coater. At this time, the second seal 15b is not disposed on the second circuit forming surface 4b of the second semiconductor 4a positioned at an uppermost position. The second seal 15b supplied to the position near the end of the chip-stacked structure 4 surrounds the periphery of the chip-stacked structure 4 and the adhesive member 12 so as to be filled in a gap between the second semiconductor chips 4a of the chip-stacked structure 4 by capillarity. At this time, the second seal 15b surrounding the periphery of the chip-stacked structure 4 is mostly held on one surface (the side of the supporting substrate 13) of the chip-stacked structure 4 by gravity, and the cross section thereof has a trapezoidal shape.

After the supply of the underfill material (the second seal 15b) to the chip-stacked structure 4 is finished, the chip-stacked structure 4 is cured at a predetermined temperature, for example, about 150° C. Thus, the underfill material (the second seal 15b) is thermally cured so as to form the second seal 15b.

Forming Third Seal 15c:

As shown in FIG. 8C, the third seal 15c is formed.

First, the supporting substrate 13 is formed by a transfer mold device (not shown). The chip-stacked structure 4 and the second seal 15b are disposed in the cavity of the transfer mold device by clamping. At this time, the other surface of the chip-stacked structure 4 is closely attached within the cavity through an elastic sheet.

Heated and melted seal resin (third seal 15c) is injected from a gate portion formed in the upper mold of the mold device into the cavity. At this time, since the other surface of the chip-stacked structure 4 is closely attached within the cavity, the seal resin (third seal 15c) is not disposed on the other surface of the chip-stacked structure 4 and surrounds only the periphery of the second seal 15b.

Curing is performed at a predetermined temperature, for example, about 180° C. in a state in which the seal resin (the third seal 15c) is filled in the cavity so as to form the third seal 15c collectively covering the other surface of the supporting substrate 13 and the plurality of second seals 15b. At this time, the second seal 15b is filled in the gap between the stacked second semiconductor chips 4a, thereby preventing the void from being generated between the second semiconductor chips 4a.

Thereafter, the supporting substrate 13 is baked at a predetermined temperature so as to completely cure the third seal 15c.

Forming Wire Bumps 10:

The wire bumps 10 are formed on the second bump electrodes 5d exposed by the other surface of the chip-stacked structure 4.

First, by a wire bonding device (not shown), a melted wire having a ball formed on a front end thereof is bonded on the second bump electrode 5d by ultrasonic thermo-compression bonding. The rear end of the wire is cut off in a state in which the wire is bonded to the second bump electrode 5d so as to form the wire bumps 10. By repeating the same process, the wire bumps 10 are formed on all the second bump electrodes 5d. The wire used in the wire bumps 10 is, for example, formed of Au or the like, but may be formed of a soldering bump. In addition, although it is preferable that the wire bumps 10 are formed, the wire bump may not be formed in the present embodiment.

Applying Second Seal 15b:

As shown in FIG. 8D, the second seal 15b is applied by a dispenser 52 so as to cover the other surface of the chip-stacked structure 4 and the wire bumps 10. The second seal 15b is a liquid and is, for example, formed of epoxy resin.

Mounting First Wiring Board 2:

As shown in FIG. 8E, the first wiring board 2 is mounted on the second seal 15b.

First, the first wiring board 2, the other surface of which is sucked and held by the bonding tool 51, is mounted on the second seal 15b such that the first bump electrodes 5a and the wire bumps 10 are matched to each other. Then, a load is applied to the first bump electrodes 5a and the wire bumps 10, for example, at about 300° C. By this operation, flip chip bonding is performed and the first bump electrodes 5a and the second bump electrodes 5d are electrically bonded through the wire bumps 10. This bonding may be performed by applying ultrasonic waves as well as the load.

In this boding, by applying the load from the other surface of the first wiring board 2, the second seal 15b is rolled up to the end of the first wiring board 2 and the size in plan view thereof becomes the same size as the first wiring board 2.

In the present embodiment, since the wire bumps 10 are formed on the second bump electrodes 5*d*, it is possible to facilitate the connection between the first bump electrodes 5*a* and the second bump electrodes 5*d* through the second seal 15*b*.

In addition, in the step of forming the wire bumps 10, in the case where the wire bumps 10 are not formed on the second bump electrodes 5*d*, the first bump electrodes 5*a* and the second bump electrodes 5*d* may not be directly bonded.

Mounting Soldering Balls 9:

As shown in FIG. 8F, the soldering balls 9 are mounted on the other surface of the first lands 7.

First, conductive metal balls, for example, the soldering balls 9 are sucked and held by the mount tool 53 so as to be matched to the plurality of first lands 7 disposed on the other surface of the first wiring board. Next, flux is transferred and formed on the sucked and held soldering balls 9 so as to be collectively mounted on the other surface of the plurality of first lands 7. After the soldering balls 9 are mounted on all the first lands 7, the first wiring board 2 is reflowed so as to form the soldering balls 9.

Dividing Third Seal 15*c* and Supporting Substrate 13:

As shown in FIG. 8G, the method progresses to a board dicing step, in which the third seal 15*c* and the supporting substrate 13 are divided according to the second dicing lines 29.

First, one surface of the supporting substrate 13 is attached and supported to a dicing tape 16. The third seal 15*c* and the supporting substrate 13 are horizontally and vertically cut by the dicing blade 50 along the second dicing lines 29 so as to be divided in units of second product formation portions 31. At this time, since the third seal 15*c* is formed on the other surface of the supporting substrate 13, the second dicing lines 29 cannot be recognized. However, since cutting marks 30 are formed on the frame portion 27, the recognition of cut positions and the division of second product formation portions 31 are possible. Thereafter, the supporting substrate 13 is picked up from the dicing tape 16 so as to obtain the semiconductor device 1*b* shown in FIG. 4J.

According to the method of manufacturing the semiconductor device 1*b* of the present embodiment, after the first wiring board 2 is formed in advance, the first wiring board 2 is mounted on the chip-stacked structure 4. By this operation, even when the first semiconductor chip 3 is stacked on the chip-stacked structure 4, it is possible to prevent a conventional problem that a void is generated in a step difference between the first semiconductor chip 3 and the second semiconductor chip 4*a*.

Since the size in plan view of the first wiring board 2 is less than that of the second product formation portion 31, it is possible to suppress a problem that the contact of the first wiring board 2 on the neighboring second product formation portion 31 at the time of mounting onto the second seal 15*b*. Similarly, it is possible to suppress a problem that the second seal 15*b* flows to the neighboring second product formation portion 31 at the time of mounting onto the second seal 15*b*. Accordingly, it is possible to satisfactorily mount the first wiring board 2.

Third Embodiment

Hereinafter, a semiconductor device 1*c* according to a third embodiment of the present invention will be described with reference to the drawings. In addition, the detailed description of the same portions as the semiconductor device 1*b* according to the second embodiment will be omitted.

FIG. 9 is a cross-sectional elevational view illustrating a semiconductor device 1*c* in a step involved in a method of forming a semiconductor device assembly according to the third embodiment of the present invention. FIG. 10 is a cross-sectional elevational view illustrating a semiconductor device 1*c* in a step, subsequent to the step of FIG. 9, involved in a method of forming a semiconductor device assembly according to the third embodiment of the present invention.

The semiconductor device 1*c* of the present embodiment schematically includes a first wiring board 2 having a first semiconductor chip 3 mounted therein and having a substantially rectangular shape in plan view, a second seal 15*b* disposed on one surface of the first wiring board 2, and a second wiring board 19 disposed on one surface of the second seal 15*b*, having a second semiconductor chip 4*a* mounted therein and having a substantially rectangular shape in plan view.

First Wiring Board 2:

The first wiring board 2 includes the first semiconductor chip 3, first bump electrodes 5*a* and first bump electrodes 5*b*, wire bumps 10 connected to the first bump electrodes 5*a*, and a first base 11 (first rewiring layers 6, a first insulating layer 8, and first lands 7). The configuration is equal to that of the semiconductor device 1*b* of the second embodiment and the detailed description thereof will be omitted.

Second Seal 15*b*:

The second seal 15*b* of the present embodiment is, for example, formed of an NCP formed of epoxy resin and is formed so as to surround one surface of the first wiring board 2, and the periphery of the first bump electrodes 5*a*, the wire bumps 10 and the second bump electrodes 5*d*. The second seal 15*b* has a substantially rectangular shape and the size in plan view thereof is equal to that of the second wiring board 19.

Second Wiring Board 19:

The second wiring board 19 includes the second semiconductor chip 4*a*, the second bump electrodes 5*c* and 5*d*, a fourth seal 15*d*, and a second base 11*a* (second rewiring layers 6*a*, a second insulating layer 32, and second lands 7*a*).

The second semiconductor chip 4*a* is formed of a board made of Si or the like, and a memory circuit (second circuit formation surface 4*b*) is formed on the other surface thereof when viewed from the first wiring board 2. The outer surface of the second circuit formation surface 4*b* is sealed by the second seal 15*b*. The size in plan view of the second semiconductor chip 4*a* is greater than that of the first semiconductor chip 3 and the thickness thereof is about 50 μm.

A plurality of second bump electrodes 5*c* and 5*d* are formed on one surface and the other surface of the second semiconductor chip 4*a*, respectively. The plurality of second bump electrodes 5*c* formed on one surface are electrically connected to the second bump electrodes 5*d* of the other surface through the second through electrodes 14*b*, respectively.

The fourth seal 15*d* has the same thickness as the second semiconductor chip 4*a* and is formed so as to surround the periphery of the second semiconductor chip 4*a*. By this configuration, one surface and the other surface of the second semiconductor chip 4*a* are exposed so as to have a substantially rectangular configuration in which the second semiconductor chip 4*a* is mounted. The size in plan view of the outer circumference of the fourth seal 15*d* is smaller than the size in plan view of the first wiring board 2.

The second base 11*a* includes the second rewiring layers 6*a*, the second insulating layer 32 and the second lands 7*a*.

The second rewiring layers 6a are formed on one surface of the second semiconductor chip 4a and the fourth seal 15d.

The second insulating layer 32 is configured by stacking a first layer 32a of the second insulating layer and a second layer 32b of the second insulating layer and is formed so as to cover one surface of the second semiconductor chip 4a and the fourth seal 15d and the second rewiring layers 6a. The second insulating layer 32 is formed on one surface of the second wiring board 19, whereas the first insulating layer 8 is formed on the other surface of the first wiring board 2.

The plurality of second lands 7a is formed on portions exposed from the second insulating layer 32 of the second rewiring layers 6a. The second lands 7a and the second bump electrodes corresponding thereto are electrically connected by the second rewiring layers 6a, respectively. In addition, the plurality of second lands 7a is arranged on one surface of the second insulating layer 32 in a lattice shape at a predetermined interval.

According to the semiconductor device 1c of the present embodiment, since the first wiring board having the first semiconductor chip 3 mounted therein and the second wiring board 19 having the second semiconductor chip 4a mounted therein are disposed through the second seal 15b, it is possible to realize dimensional-reduction of the semiconductor device 1c and improvement of electrical characteristics.

FIG. 9 is a cross-sectional elevational view of an example of laminating and mounting another semiconductor device 40 on the semiconductor device 1c according to the present embodiment. Since the soldering balls 9 can be mounted on both one surface and the other surface of the semiconductor device 1c, it is possible to easily laminate and mount another semiconductor device 40.

A method of manufacturing the semiconductor device 1c of the present embodiment will be described.

FIGS. 11A to 11E are cross-sectional elevational views illustrating a method of manufacturing the semiconductor device 1c according to the third embodiment of the present invention.

The method of manufacturing the semiconductor device 1c of the present embodiment schematically includes steps of forming the first wiring mother board 2a and the second wiring board 19, forming the wire bumps 10, applying the second seal 15b, mounting the second wiring board 19, and mounting the soldering balls 9. Hereinafter, each step will be sequentially described, but the description of the same portions as the second embodiment will be omitted.

Forming First Wiring Mother Board 2a and Second Wiring Board 19:

The step of forming the first wiring mother board 2a is equal to that of the first embodiment and thus the description thereof will be omitted.

The step of forming the second wiring board 19 includes steps of mounting the second semiconductor chip 4a on a support 21, forming the fourth seal 15d, and forming the second base 11a (the second rewiring layers 6a, the second insulating layer 32 and the second lands 7a), similar to the step of forming the first wiring board 2. Hereinafter, each step will be sequentially described.

Mounting Second Semiconductor Chip 4a:

First, the second circuit forming surface 4b of the second semiconductor chip 4a is adhered to the support 21. By this operation, the second semiconductor chips 4a are arranged on the support 21 in a state in which an opposite surface of the second circuit forming surface 4b thereof is exposed in a matrix.

Forming Fourth Seal 15d:

A liquid seal resin (fourth seal 15d) is dropped on the support 21. At this time, the opposite surface of the second circuit forming surface 4b of the second semiconductor chip 4a is not covered by the seal resin (fourth seal 15d) and the seal resin is filled so as to have the same thickness as the second semiconductor chip 4a. The seal resin (fourth seal 15d) is cured. By this operation, the seal resin (fourth seal 15d) is thermally cured so as to form the fourth seal 15d.

Forming Second Base 11a:

The second base 11a (the second rewiring layers 6a, the second insulating layer 32 and the second lands 7a) is formed.

First, the first layer 32a of the second insulating layer is formed on one surface of the second semiconductor chip 4a and the fourth seal 15d. The second rewiring layers 6a and the second lands 7a are provided on one surface thereof and the second layer 32b of the second insulating layer is formed so as to cover a region excluding the second lands 7a. Accordingly, the second wiring mother board 19a (not shown) formed of the second wiring board 19 is formed.

The method progresses to a board dicing step, in which the second wiring mother board 19a is cut so as to form the second wiring board 19.

Forming Wire Bumps 10:

As shown in FIG. 11A, the first wiring mother board 2a is prepared. Next, by a wire bonding device (not shown), the wire bumps 10 are formed on the first bump electrodes 5a exposed to one surface of the first wiring mother board 2a. By repeating the same process, the wire bumps 10 are formed on all the second bump electrodes 5d. The wire used in the wire bumps 10 is, for example, formed of Au or the like, but may be formed of a soldering bump.

Applying Second Seal 15b:

As shown in FIG. 11B, the second seal 15b is applied by a dispenser 52 so as to cover one surface of the first wiring board 2 and the wire bumps 10. The second seal 15b is a liquid and is, for example, formed of epoxy resin.

Mounting Second Wiring Board 19:

As shown in FIG. 11C, the second wiring board 19 is mounted on one surface of the second seal 15b.

First, the second wiring board 19 one surface of which is sucked and held by the bonding tool 51, is mounted on the second seal 15b such that the second bump electrodes 5d and the wire bumps 10 are matched to each other. Then, a load is applied to the second bump electrodes 5d and the wire bumps 10, for example, at about 300° C. By this operation, flip chip bonding is performed and the first bump electrodes 5a and the second bump electrodes 5d are electrically bonded through the wire bumps 10. This bonding may be performed by applying ultrasonic waves as well as the load.

In this boding, by applying the load from one surface of the second wiring board 19, the second seal 15b is rolled up to the end of the second wiring board 19 and the size in plan view thereof becomes the same shape as the second wiring board 19.

Mounting Soldering Balls 9:

As shown in FIG. 11D, the soldering balls 9 are mounted on the other surface of the first lands 7. After the soldering balls 9 are mounted on all the first lands 7, the first wiring board 2 is reflowed so as to form the soldering balls 9.

As shown in FIG. 11E, the method progresses to a board dicing step, in which the first wiring mother board 2a is divided.

One surface of the second wiring board 19 is attached and supported to a dicing tape 16. The first wiring mother board 2a is horizontally and vertically cut by the dicing blade 50 along the gap between the neighboring second wiring board

19. Thereafter, the second wiring board 19 is picked up from the dicing tape 16 so as to obtain the semiconductor device 1c shown in FIG. 8.

According to the method of manufacturing the semiconductor device 1c of the present embodiment, the first wiring board 2 and the second wiring board 19 are adhered through the second seal 15b. By this operation, even when the second semiconductor chip 4a with a different size in plan view is stacked on the first semiconductor chip 3, it is possible to prevent a conventional problem that a void is generated in a step difference between the first semiconductor chip 3 and the second semiconductor chip 4a.

Since the size in plan view of the second wiring board 19 is less than that of the first wiring board 2, it is possible to suppress a problem that the second seal 15b flows to the neighboring second wiring board 19 when mounting onto the second seal 15b. Accordingly, it is possible to satisfactorily mount the second wiring board 19 on the second seal 15b.

Hereinafter, a semiconductor device 1d according to a fourth embodiment of the present invention will be described in detail with reference to the drawings. In addition, the detailed description of the same portions as the semiconductor devices 1a, 1b and 1c will be omitted.

FIG. 12 is a cross-sectional elevational view illustrating a structure of the semiconductor device 1d according to the fourth embodiment of the present invention. FIG. 13 is a cross-sectional elevational view illustrating an example of the case where the number of stacked second semiconductor chips 4a of the semiconductor device 1d of FIG. 12 is increased.

The semiconductor device 1d of the present embodiment schematically includes a first wiring board 2 having a first semiconductor chip 3 mounted therein and having a substantially rectangular shape in plan view, a second seal 15b disposed on one surface of the first wiring board 2, a third wiring board 34 disposed on one surface of the second seal 15b and having a chip-stacked structure 4 mounted therein, and an insulating film 33.

First Wiring Board 2:

The first wiring board 2 includes the first semiconductor chip 3, first bump electrodes 5a and first bump electrodes 5b, wire bumps 10 connected to the first bump electrodes 5a, a first seal 15a, and a first base (first rewiring layers 6, a first insulating layer 8, and first lands 7). The configuration is equal to that of the above-described semiconductor devices 1a, 1b and 1c and the detailed description thereof will be omitted.

Second Seal 15b:

The second seal 15b is formed so as to cover one surface of the first wiring board 2, and surround the periphery of the first bump electrodes 5a, the wire bumps 10 and the second bump electrodes 5d. The second seal 15b has a substantially rectangular shape and the size in plan view thereof is equal to that of the first wiring board 2.

Third Wiring Board 34:

The third wiring board 34 schematically includes a chip-stacked structure 4 formed of the second semiconductor chips 4a, the second bump electrodes 5c and 5d, the second seal 15b, and a fifth seal 15e.

The chip-stacked structure 4 is configured by stacking the second semiconductor chips 4a on one surface of the second seal 15b such that the second circuit forming surface 4b faces the other surface. The size in plan view of the second semiconductor chips 4a is greater than the size in plan view of the first semiconductor chip 3.

A plurality of second bump electrodes 5c and 5d are formed on one surface and the other surface of each of the second semiconductor chips 4a, respectively. The plurality of second bump electrodes 5c formed on one surface are electrically connected to the second bump electrodes 5d of the other surface through the second through electrodes 14b, respectively.

The second seal 15b is filled between the second semiconductor chips 4a of the chip-stacked structure 4 and is formed so as to surround the periphery of the chip-stacked structure 4.

The fifth seal 15e has the same thickness as the chip-stacked structure 4 and is formed so as to surround the periphery of the second seal 15b. By this configuration, one surface and the other surface of the chip-stacked structure 4 are exposed so as to have a substantially rectangular configuration in which the chip-stacked structure 4 are mounted.

Insulating Film 33:

The insulating film 33 is formed so as to cover one surface of the third wiring board 34 and seals the second bump electrodes 5c of one surface of the chip-stacked structure 4.

According to the semiconductor device 1d of the present embodiment, since the first wiring board 2 in which the first semiconductor chip 3 is mounted and the third wiring board 34 in which the chip-stacked structure 4 is mounted are configured through the second seal 15b, it is possible to realize dimensional-reduction of the semiconductor device 1d and improvement of electrical characteristics. By increasing the number of second semiconductor chips 4a as compared with the semiconductor device 1c of the third embodiment, it is possible to realize larger capacity.

FIG. 13 is a cross-sectional elevational view of an example of the case where the number of second semiconductor chips 4a of the chip-stacked structure 4 of the semiconductor device 1d of the present embodiment is increased. As shown in FIG. 12, in the semiconductor device 1d, since the third wiring board 34 is easily replaced, it is possible to easily change capacity by the third wiring board 34 different in the number of stacked second semiconductor chips 4a.

The method of manufacturing the semiconductor chip 1d according to the present embodiment will be described.

FIGS. 14A to 14H are cross-sectional elevational views illustrating the method of manufacturing the semiconductor device 1d according to the fourth embodiment of the present invention.

The method of manufacturing the semiconductor device 1d of the present embodiment schematically includes steps of forming the first wiring board 2, forming a third wiring mother board 34a, applying the second seal 15b, mounting the first wiring board 2, mounting the soldering balls 9, and dividing the third wiring mother board 34a to the third wiring board 34. Hereinafter, each step will be sequentially described, but the description of the same portions as the first, second and third embodiments will be omitted.

Forming Third Wiring Mother Board 34a:

The step of forming the third wiring mother board 34a includes steps of forming the chip-stacked structure 4, forming the second seal 15b, forming the fifth seal 15e, and forming the insulating film 33. Hereinafter, each step will be sequentially described with reference to FIGS. 14A to 14D.

Forming First Wiring Board 2:

The step of forming the first wiring board 2 is equal to that of the second embodiment and thus the description thereof will be omitted.

Forming Chip-Stacked Structure 4:

As shown in FIG. 14A, the chip-stacked structure 4 is formed.

First, a frame 20 is prepared on which a support 21 having a frame shape and formed of an adhesion tape is stuck.

The opposite side of the second circuit forming surface 4b of the second semiconductor chip 4a is sucked and held by the bonding tool 51 and is mounted on one surface of the support.

Similarly, the second semiconductor chip 4a is mounted on one surface of the second semiconductor chip 4a. At this time, the second semiconductor chip 4a is stacked such that the second circuit forming surface 4b faces the side of the support 21.

At this time, the second semiconductor chips 4 are mounted such that mutual second bump electrodes 5c and the second bump electrodes 5d are matched and a load is applied to both the bump electrodes at a high temperature, for example, about 300° C. Therefore, the second bump electrodes 5c and the second bump electrodes 5d are electrically bonded.

Forming Second Seal 15b:

As shown in FIG. 14B, the second seal 15b is formed.

First, a liquid underfill material (the second seal 15b) is supplied to a position near the end of the chip-stacked structure 4 by a dispenser 52 of a coater. At this time, the underfill material (the second seal 15b) is not disposed on one surface of the chip-stacked structure 4. The underfill material (the second seal 15b) supplied to the position near the end of the chip-stacked structure 4 surrounds the periphery of the chip-stacked structure 4 so as to be filled in a gap between the stacked second semiconductor chips 4a of the chip-stacked structure 4 by capillarity. At this time, the underfill material (the second seal 15b) surrounding the periphery of the chip-stacked structure 4 is mostly held on the other surface (the support 21) of the chip-stacked structure 4 by gravity, and the cross section thereof has a trapezoidal shape.

After the supply of the underfill material (the second seal 15b) to the chip-stacked structure 4 is finished, the chip-stacked structure 4 is thermally cured so as to form the second seal 15b.

Forming Fifth Seal 15e:

As shown in FIG. 14C, the fifth seal 15e is formed. First, liquid seal resin is dropped on the support 21 by a potting device (not shown) or the like. At this time, the seal resin (the fifth seal 15e) is filled so as not to cover one surface of the chip-stacked structure 4 and so as to have the same thickness as the chip-stacked structure 4. The seal resin (the chip-stacked structure 4) is cured at about 180° C. so as to form the fifth seal 15e.

Forming Insulating Film 33:

As shown in FIG. 14D, the insulating film 33 is formed using a photolithography technique, an etching technique or the like so as to cover one surface of the chip-stacked structure 4 and the fifth seal 15e. The support 21 is removed from the other surface of the chip-stacked structure 4.

Applying Second Seal 15b:

First, the wire bumps 10 are formed on the second bump electrodes 5d exposed to the other surface of the chip-stacked structure 4. As shown in FIG. 14E, the second seal 15b is coated with dispenser 52 so as to cover the other surface of the chip-stacked structure 4 and the wire bumps 10.

Mounting of First Wiring Board 2:

As shown in FIG. 14F, the first wiring board 2 is mounted on the other surface of the second seal 15b.

First, the first wiring board 2, one surface of which is sucked and held by the bonding tool 51, is mounted on the second seal 15b such that the first bump electrodes 5a and the wire bumps 10 are matched to each other. Then, a load is applied to the first bump electrodes 5a and the wire bumps 10, for example, at about 300° C. By this operation, the first bump electrodes 5a and the second bump electrodes 5d are electrically bonded through the wire bumps 10.

In this boding, by applying the load from the other surface of the first wiring board 2, the second seal 15b is rolled up to the end of the first wiring board 2 and the size in plan view thereof becomes the same shape as the first wiring board 2.

Mounting Soldering Balls 9:

As shown in FIG. 14G, the soldering balls 9 are mounted on the other surface of the first lands 7. After the soldering balls 9 are mounted on all the first lands 7, the first wiring board 2 is reflowed so as to form the soldering balls 9.

Dividing Third Wiring Mother Board 34a:

As shown in FIG. 14H, the method progresses to a board dicing step, in which the third wiring mother board 34a is divided into third wiring boards 34.

First, the insulating film 33 of the third wiring mother board 34a is attached and supported to a dicing tape 16. The third wiring mother board 34a is horizontally and vertically cut by a dicing blade 50 along a gap between the adjacent first wiring boards 2. Thereafter, the third wiring board 34 is picked up from the dicing tape 16 so as to obtain the semiconductor device 1d shown in FIG. 12.

According to the method of manufacturing the semiconductor device 1d of the present embodiment, the first wiring board 2 and the second wiring board 19 are bonded through the second seal 15b. Therefore, even in the configuration in which the second semiconductor chips 4a different in size in plan view are stacked on the first semiconductor chip 3, it is possible to prevent a conventional problem in which a void is generated in a step difference between the first semiconductor chip 3 and the second semiconductor chip 4a.

Since the size in plan view of the second wiring board 19 is less than that of the third wiring board 34 in the area, it is possible to suppress a problem that the second seal 15b flows to the neighboring second wiring board 19 at the time of mounting onto the second seal 15b. Accordingly, it is possible to satisfactorily mount the second wiring board 19 on the second seal 15b.

Although the present invention was described based on embodiments, the present invention is not limited to the above embodiments, various modifications are made without departing from the scope of the present invention.

Although the semiconductor device in which the second semiconductor chip 4a formed of the memory chip and the first semiconductor chip 3 formed of the interface chip are connected by the first through electrode 14a is described in the present embodiment, the type of the chip is not limited thereto. If the second semiconductor chip 4a and the first semiconductor chip 3 are electrically connected by the first through electrode 14a, for example, a combination of chips having certain functions such as a combination of a memory chip and a logic chip may be used.

Although the case where one or more memory chips (the second semiconductor chips 4a) and one interface chip (the first semiconductor chip 3) are connected is described in the present embodiment, the number of stacked chips is not limited if a chip laminate of two stages or more electrically connected by the first through electrode 14a or the second through electrode 14b is used.

Although a BGA semiconductor device is described in the present invention, the present invention is applicable to other semiconductor devices such as Land Grid Array (LGA).

As used herein, the following directional terms "over, under, forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising,
a first semiconductor chip including a first surface, a second surface opposite to the first surface, a side surface joined to the first and second surfaces to define an edge thereof, and a first electrode formed on the second surface;
a first seal that seals the side surface and includes a lower surface which is substantially coplanar with the second surface of the first semiconductor chip;
a rewiring layer formed over the second surface of the first semiconductor chip and at least a part of the lower surface of the first seal, and electrically connected to the first electrode of the first semiconductor chip;
a second semiconductor chip stacked over the first surface of the first semiconductor chip; and
a second seal that seals at least a first gap between the first semiconductor chip and the second semiconductor chip,
wherein the first semiconductor chip includes a second electrode formed on the first surface, the second electrode being electrically connected to the first electrode, and
the second semiconductor chip includes a third electrode formed on a third surface thereof, the second semiconductor chip is stacked over the first surface of the first semiconductor chip so that the third electrode is electrically connected to the second electrode of the first semiconductor chip.

2. The semiconductor device according to claim 1, wherein the second semiconductor chip includes a fourth electrode formed on a fourth surface that is opposite to the third surface, the fourth electrode being electrically connected to the third electrode.

3. The semiconductor device according to claim 1, further comprising:
a third semiconductor chip stacked over the second semiconductor chip, the second semiconductor chip being between the first semiconductor chip and the third semiconductor chip.

4. The semiconductor device according to claim 1 further comprising:
an insulating layer formed in contact with the second surface of the first semiconductor chip and with the lower surface of the first seal so as to expose the first electrode of the first semiconductor chip.

5. The semiconductor device according to claim 3, further comprising:
a third seal that seals a second gap between the second and third semiconductor chips, and at least a side surface of the second semiconductor chip,
wherein the second seal seals the first gap.

6. The semiconductor device according to claim 3, further comprising:
a supporting substrate adhered to the third semiconductor chip, the third semiconductor chip being between the second semiconductor chip and the supporting substrate.

7. The semiconductor device according to claim 2, further comprising:
a third seal that seals a side surface of the second semiconductor chip, the third seal includes an upper surface that is substantially coplanar with the fourth surface of the second semiconductor chip; and
a second rewiring layer is formed over the fourth surface of the second semiconductor chip and at least a part of the upper surface of the third seal.

8. The semiconductor device according to claim 1, wherein the first semiconductor chip is an interface chip or a logic chip, and the second semiconductor chip is a memory chip.

9. A device comprising:
a first semiconductor chip including a first main surface and a second main surface opposite to the first main surface, the first semiconductor chip further including a plurality of chip electrodes on a side of the first main surface;
a first seal including a third main surface and a fourth main surface opposite to the third main surface, the first seal including a hole formed therein and being substantially the same in thickness as the first semiconductor chip to accommodate the first semiconductor chip in the hole such that the third main surface of the first seal is substantially coplanar with the first main surface of the first semiconductor chip and the fourth main surface of the first seal is substantially coplanar with the second main surface of the first semiconductor chip;
an insulating layer formed in contact with the first main surface of the first semiconductor chip and with the third main surface of the first seal, the insulating layer including
a plurality of holes that expose the chip electrodes of the first semiconductor chip, respectively;
a plurality of ball electrodes formed over the insulating layer apart from the chip electrodes;
a plurality of rewiring layers each formed on the insulating layer to interconnect an associated one of the chip electrodes to a corresponding one of the ball electrodes;
a second semiconductor chip stacked over the second surface of the first semiconductor chip; and
a second seal that seals at least a first gap between the first and second semiconductor chips.

10. The device according to claim 9, wherein the second semiconductor chip is greater in size than the first semiconductor chip.

11. The device according to claim 9, further comprising:
a plurality of second chip electrodes formed on the second main surface of the first semiconductor chip, the second chip electrodes being electrically connected to the first chip electrodes,
wherein the second semiconductor chip includes a plurality of third chip electrodes formed on a fifth main surface thereof, the second semiconductor chip is stacked over the second main surface of the first semiconductor chip so that the third chip electrodes electrically connects to the second chip electrodes of the first semiconductor chip.

12. The device according to claim 11, wherein the second semiconductor chip includes a plurality of fourth chip electrodes formed on a sixth main surface that is opposite to the fifth main surface, the fourth chip electrodes being electrically connected to the third electrodes.

13. A device comprising:
a first semiconductor chip including a first main surface and a second main surface opposite to the first main surface, the first semiconductor chip further including a plurality of chip electrodes on a side of the first main surface;
a first seal including a third main surface and a fourth main surface opposite to the third main surface, the first seal including a hole formed therein and being substantially the same in thickness as the first semiconductor chip to accommodate the first semiconductor chip in the hole such that the third main surface of the first seal is substantially coplanar with the first main surface of the first semiconductor chip and the fourth main surface of the first seal is substantially coplanar with the second main surface of the first semiconductor chip;
an insulating layer formed in contact with the first main surface of the first semiconductor chip and with the third main surface of the first seal, the insulating layer including a plurality of holes that expose the chip electrodes of the first semiconductor chip, respectively;
a plurality of ball electrodes formed over the insulating layer apart from the chip electrodes;
a plurality of rewiring layers each formed on the insulating layer to interconnect an associated one of the chip electrodes to a corresponding one of the ball electrodes; and
a chip stacked structure including a plurality of second semiconductor chips that are stacked on one another, the chip stacked structure including a plurality of bump electrodes on a lowermost one of the second semiconductor chips, and the chip stacked structure stacked over the second main surface of the first semiconductor chip, the bump electrodes being electrically connected to the chip electrodes of the first semiconductor chip.

14. The device according to claim 13, wherein the plurality of second semiconductor chips include a plurality of through electrodes and the second semiconductor chips are electrically connected to one another via the through electrodes.

15. The device according to claim 13, wherein the chip stacked structure includes a supporting substrate, the supporting substrate is stacked over an uppermost one of the second semiconductor chips, the second semiconductor chips being between the first semiconductor chip and the supporting substrate.

16. The device according to claim 9, wherein the second semiconductor chip includes a fifth main surface facing the first semiconductor chip and a sixth main surface opposite to the fifth main surface, and the device further comprising:
a third seal including a seventh main surface and a eighth main surface opposite to the seventh main surface, the third seal including a hole formed therein and being substantially the same in thickness as the second semiconductor chip to accommodate the second semiconductor chip in the hole such that the seventh main surface of the third seal is substantially coplanar with the fifth main surface of the second semiconductor chip and the eighth main surface of the third seal is substantially coplanar with the sixth main surface of the second semiconductor chip;
a second insulating layer formed in contact with the sixth main surface of the second semiconductor chip and with the eighth main surface of the third seal, the second insulating layer including a plurality of holes that expose parts of the second semiconductor chip, respectively;
a plurality of second chip electrodes each formed in associated one of the holes of the second insulating layer to be in contact with a corresponding one of the parts of the second semiconductor chip;
a plurality of land electrodes formed over the second insulating layer apart from the second chip electrodes; and
a plurality of second rewiring layers each formed on the second insulating layer to interconnect an associated one of the second chip electrodes to a corresponding one of the land electrodes.

17. The device according to claim 9, wherein the first semiconductor chip is an interface chip or a logic chip, and the second semiconductor chip is a memory chip.

18. The semiconductor device according to claim 1, wherein the second semiconductor chip is greater in size than the first semiconductor chip.

19. A device comprising:
a first semiconductor chip including a first surface, a second surface opposite to the first surface, side surfaces joined to the first and second surfaces to define edges thereof, and a plurality of first electrodes formed on the second surface;
a first sealing resin surrounding the side surfaces of the first semiconductor chip, the first sealing resin being in direct contact with the side surfaces of the first semiconductor chip and including a lower surface which is substantially coplanar with the second surface of the first semiconductor chip, the lower surface of the first sealing resin including a plurality of portions;
an insulating layer formed in contact with the second surface of the first semiconductor chip and with the lower surface of the first sealing resin, the insulating layer including a plurality of holes that expose the first electrodes of the first semiconductor chip, respectively;
a plurality of ball electrodes formed over the insulating layer apart from the first semiconductor chip, each of the ball electrodes being vertically aligned with an associated one of the portions of the lower surface of the first sealing resin; and
a plurality of rewiring layers each connected to an associated one of the first electrodes through an associated one of the holes of the insulating layer and elongated over the insulating layer to reach a corresponding one of the ball electrodes; wherein the first semiconductor chip includes a plurality of second electrodes formed on the first surface, the plurality of second electrodes are electrically connected to the plurality of first electrodes, respectively.

20. The device according to claim 19, further comprising:
a second semiconductor chip stacked over the first surface of the first semiconductor chip.

21. The device according to claim 20, further comprising:
a second sealing resin that seals at least a first gap between the first and second semiconductor chips.

22. The device according to claim 19, further comprising:
a supporting substrate stacked over the first surface of the first semiconductor chip, the first semiconductor chip being disposed between the insulating layer and the supporting substrate.

* * * * *